(12) United States Patent
Yamamoto

(10) Patent No.: US 10,355,673 B2
(45) Date of Patent: Jul. 16, 2019

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventor: Roh Yamamoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 46 days.

(21) Appl. No.: 15/706,984

(22) Filed: Sep. 18, 2017

(65) Prior Publication Data

US 2018/0091121 A1 Mar. 29, 2018

(30) Foreign Application Priority Data

Sep. 29, 2016 (JP) .................. 2016-191724

(51) Int. Cl.

| | | |
|---|---|---|
| *H03B 1/00* | (2006.01) | |
| *H03K 3/00* | (2006.01) | |
| *H03K 3/356* | (2006.01) | |
| *G09G 3/20* | (2006.01) | |
| *G09G 3/36* | (2006.01) | |
| *G11C 11/412* | (2006.01) | |

(Continued)

(52) U.S. Cl.
CPC ......... *H03K 3/356017* (2013.01); *G09G 3/20* (2013.01); *G09G 3/3611* (2013.01); *G11C 11/412* (2013.01); *G11C 19/28* (2013.01); *H03K 3/012* (2013.01); *H03K 3/356139* (2013.01); *H03K 19/0013* (2013.01); *H03K 19/018521* (2013.01)

(58) Field of Classification Search
CPC ... H03K 3/356017; G09G 3/20; G09G 3/3611
USPC .................................. 327/112, 333
See application file for complete search history.

(56) References Cited

U.S. PATENT DOCUMENTS 5,675,278 A * 10/1997 Tanaka ............ H03K 3/356113
    323/315
8,861,288 B2    10/2014 Ohshima
            (Continued)

FOREIGN PATENT DOCUMENTS

| JP | 2013-008433 A | 1/2013 |
|---|---|---|
| JP | 2015-188209 A | 10/2015 |

*Primary Examiner* — Metasebia T Retebo
(74) *Attorney, Agent, or Firm* — Fish & Richardson P.C.

(57) ABSTRACT

An object is to provide a level shift circuit that operates stably. A semiconductor device includes a level shift circuit including first to fourth transistors and a buffer circuit. One of a source and a drain (S/D) of the first transistor is connected to one of a source and a drain of the second transistor. The other of the source and the drain of the second transistor is connected to one of a source and a drain of the third transistor. A gate of the first transistor and a gate of the fourth transistor are connected to the other of the source and the drain of the second transistor and the one of the source and the drain of the third transistor. A gate of the third transistor is connected to a wiring to which an input signal is input. An input terminal of the buffer circuit is connected to one of a source and a drain of the fourth transistor. An output terminal of the buffer circuit is connected to a gate of the second transistor and a wiring to which an output signal is output.

10 Claims, 17 Drawing Sheets

(51) Int. Cl.
  *H03K 3/012* (2006.01)
  *H03K 19/00* (2006.01)
  *G11C 19/28* (2006.01)
  *H03K 19/0185* (2006.01)

(56) References Cited

U.S. PATENT DOCUMENTS

| | | |
|---|---|---|
| 9,105,353 B2 | 8/2015 | Nishijima |
| 9,246,476 B2 | 1/2016 | Takahashi |
| 9,537,478 B2 | 1/2017 | Takahashi |
| 9,590,594 B2 | 3/2017 | Kozuma |
| 2006/0033530 A1* | 2/2006 | Seo .................. H03K 19/0016 326/81 |
| 2013/0181762 A1 | 7/2013 | Wu et al. |

* cited by examiner

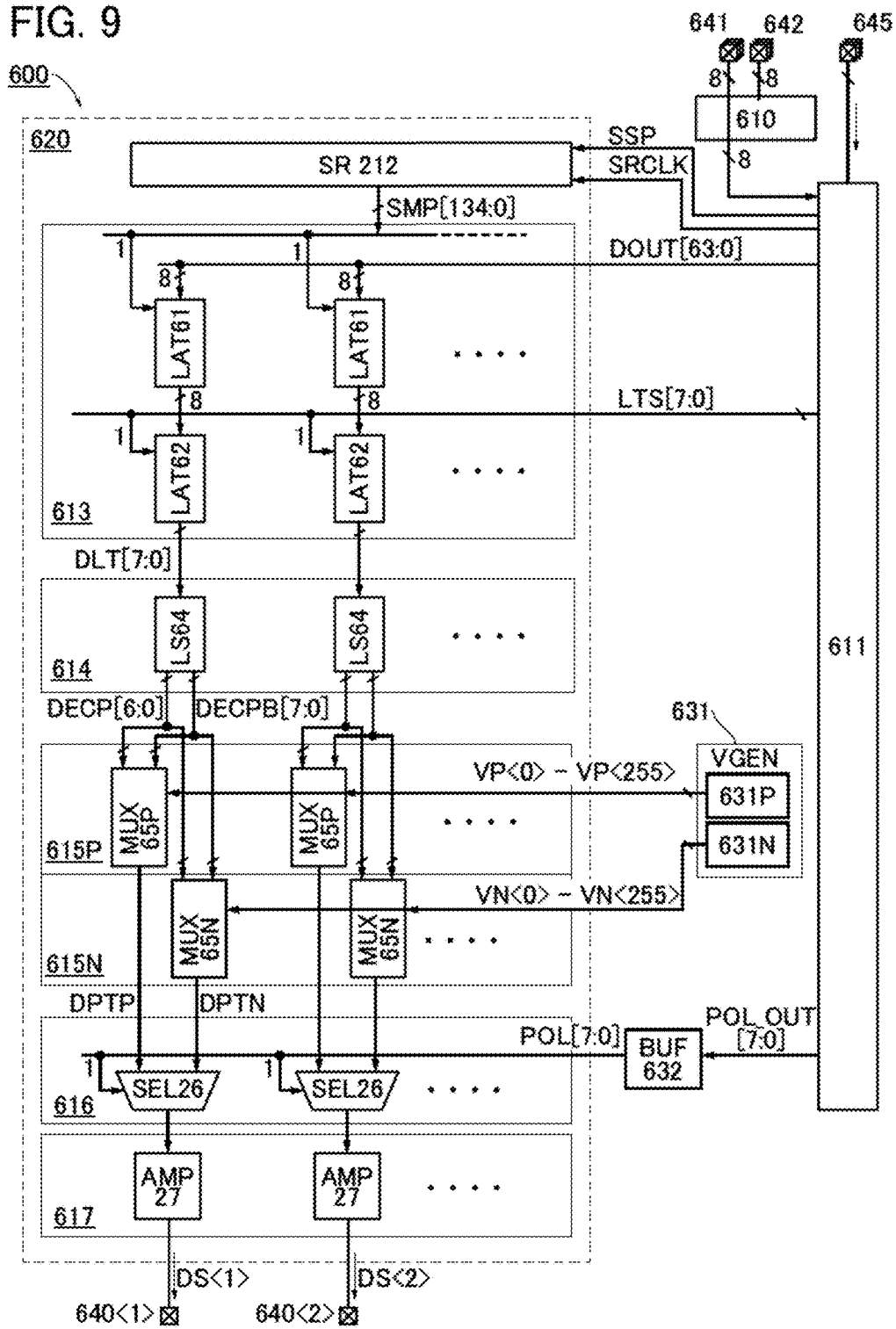

FIG. 10A
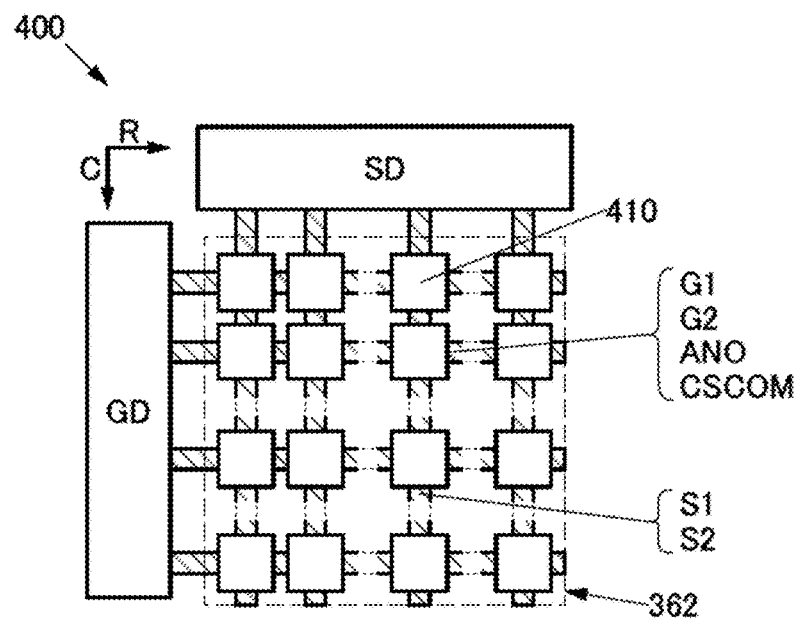
FIG. 10B1
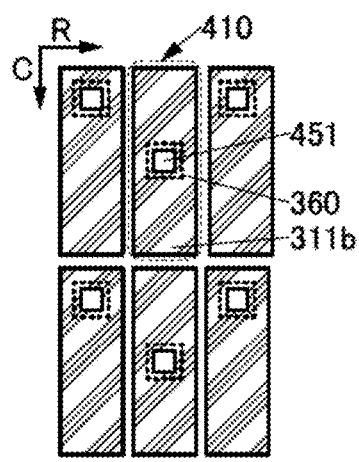
FIG. 10B2
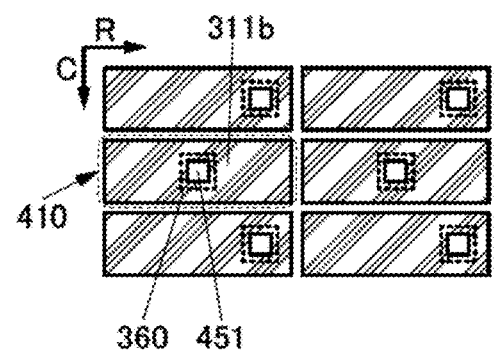

SEMICONDUCTOR DEVICE AND ELECTRONIC DEVICE

BACKGROUND OF THE INVENTION

1. Field of the Invention

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter. Specific examples of the technical field of one embodiment of the present invention disclosed in this specification include a semiconductor device, a display device, a light-emitting device, a power storage device, an imaging device, a memory device, a method for driving any of them, and a method for manufacturing any of them.

2. Description of the Related Art

High-resolution display devices are widely used. Integrated circuits (ICs) are used in source drivers of such display devices because high-speed operation is required. A driver formed using an IC is called a driver IC.

A driver IC including a source driver includes a shift register, a digital-to-analog converter circuit, and the like. Since the shift register and the digital-to-analog converter circuit are driven with different voltages, the source driver usually includes a level shift circuit (e.g., see Patent Documents 1 and 2).

PATENT DOCUMENT

Patent Document 1: Japanese Published Patent Application No. 2013-008433
Patent Document 2: Japanese Published Patent Application No. 2015-188209

SUMMARY OF THE INVENTION

In the level shift circuit, an n-channel transistor sometimes needs to have a larger size than a p-channel transistor in order to achieve more stable operation. Moreover, the size of the n-channel transistor sometimes needs to be increased as the potential level required for an output signal of the level shift circuit becomes higher.

When characteristics of transistors included in the level shift circuit are expected to vary, the size of the n-channel transistor needs to be increased in some cases.

However, the increase in size of the n-channel transistor in the level shift circuit is not desirable because problems such as increase in delay time, increase in current, and increase in area of the level shift circuit are likely to occur.

An object of one embodiment of the present invention is to provide a semiconductor device capable of operating more stably. Another object of one embodiment of the present invention is to decrease the need for increasing the size of a transistor included in a semiconductor device. Another object of one embodiment of the present invention is to suppress an increase in area of a semiconductor device. Another object of one embodiment of the present invention is to suppress an increase in power consumption of a semiconductor device.

Another object of one embodiment of the present invention is to suppress an increase in size, power consumption, and the like of an electronic device.

Objects of one embodiment of the present invention are not limited to the above objects. The objects described above do not preclude the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a semiconductor device including a level shift circuit. The level shift circuit includes a first transistor, a second transistor, a third transistor, a fourth transistor, and a buffer circuit. One of a source and a drain of the first transistor is electrically connected to one of a source and a drain of the second transistor. The other of the source and the drain of the second transistor is electrically connected to one of a source and a drain of the third transistor. A gate of the first transistor and a gate of the fourth transistor are electrically connected to the other of the source and the drain of the second transistor and the one of the source and the drain of the third transistor. A gate of the third transistor is electrically connected to a wiring to which an input signal is input. An input terminal of the buffer circuit is electrically connected to one of a source and a drain of the fourth transistor. An output terminal of the buffer circuit is electrically connected to a gate of the second transistor and a wiring from which an output signal is output.

In the semiconductor device having the above structure, it is preferred that the level shift circuit further include a fifth transistor, one of a source and a drain of the fifth transistor be electrically connected to the one of the source and the drain of the fourth transistor, and a gate of the fifth transistor be electrically connected to a wiring to which an inversion signal of the input signal is input.

In the semiconductor device having any of the above structures, the buffer circuit preferably includes a first inverter circuit and a second inverter circuit and is preferably configured as follows. The first inverter circuit has a first input terminal, a second input terminal, and an output terminal. The second inverter circuit has a first input terminal, a second input terminal, and an output terminal. The first input terminal of the first inverter circuit serves as the input terminal of the buffer circuit. The second input terminal of the first inverter circuit is electrically connected to the wiring to which the input signal is input. The first input terminal of the second inverter circuit is electrically connected to the output terminal of the first inverter circuit. The second input terminal of the second inverter circuit is electrically connected to the wiring to which the inversion signal of the input signal is input. The output terminal of the second inverter circuit serves as the output terminal of the buffer circuit.

In the semiconductor device having any of the above structures, each of the first transistor, the second transistor, and the fourth transistor is preferably a p-channel transistor.

In the semiconductor device having any of the above structures, it is preferred that each of the third transistor and the fifth transistor be an n-channel transistor including a semiconductor layer in which a channel is formed, and that the semiconductor layer contain an oxide semiconductor.

One embodiment of the present invention is a semiconductor device including a level shift circuit. The level shift circuit includes a first transistor, a second transistor, a third transistor, a fourth transistor, a fifth transistor, a sixth transistor, a seventh transistor, an eighth transistor, a ninth transistor, a tenth transistor, a first inverter circuit, and a second inverter circuit. One of a source and a drain of the first transistor is electrically connected to one of a source and a drain of the second transistor. The other of the source and the drain of the second transistor is electrically connected to one of a source and a drain of the third transistor. One of a source and a drain of the fourth transistor is electrically connected to one of a source and a drain of the fifth transistor. A gate of the first transistor and a gate of the fourth transistor are electrically connected to the other of the source and the drain of the second transistor and the one of the source and the drain of the third transistor. A gate of the sixth transistor and a gate of the ninth transistor are electrically connected to an other of a source and a drain of the seventh transistor and one of a source and a drain of the eighth transistor. A gate of the third transistor and a gate of the tenth transistor are electrically connected to a wiring to which an input signal is input. An input terminal of the first inverter circuit is electrically connected to the one of the source and the drain of the fourth transistor and the one of the source and the drain of the fifth transistor. An input terminal of the second inverter circuit is electrically connected to one of a source and a drain of the ninth transistor and one of a source and a drain of the tenth transistor. An output terminal of the first inverter circuit is electrically connected to a gate of the seventh transistor and a wiring from which an output signal is output.

The semiconductor device having the above structure preferably has a function of outputting an inversion signal of the output signal. Preferably, an output terminal of the second inverter circuit is electrically connected to a gate of the second transistor and a wiring from which the inversion signal of the output signal is output.

In the semiconductor device having any of the above structures, each of the first transistor, the second transistor, the fourth transistor, the sixth transistor, the seventh transistor, and the ninth transistor is preferably a p-channel transistor.

In the semiconductor device having any of the above structures, it is preferred that each of the third transistor, the fifth transistor, the eighth transistor, and the tenth transistor be an n-channel transistor including a semiconductor layer in which a channel is formed, and that the semiconductor layer contain an oxide semiconductor.

The semiconductor device having any of the above structures preferably includes at least one of a logic circuit, a shift register, a latch circuit, a digital-to-analog converter circuit, a multiplexer, and an amplifier circuit.

One embodiment of the present invention is an electronic device including the semiconductor device having any of the above structures, and at least one of a display portion, a touch sensor, a camera, a speaker, a microphone, and an operation key.

One embodiment of the present invention can provide a level shift circuit capable of operating more stably. One embodiment of the present invention can decrease the need for increasing the size of a transistor included in a level shift circuit. One embodiment of the present invention can suppress an increase in area of a semiconductor device. One embodiment of the present invention can suppress an increase in power consumption of a level shift circuit.

One embodiment of the present invention can suppress an increase in size, power consumption, and the like of an electronic device.

Effects of one embodiment of the present invention are not limited to the above effects. The effects described above do not preclude the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

BRIEF DESCRIPTION OF THE DRAWINGS

In the accompanying drawings:

FIG. 9 is a block diagram illustrating a structure example of a source driver IC;

FIG. 10A illustrates circuits of a display device, and FIGS. 10B1 and 10B2 are top views of pixels;

DETAILED DESCRIPTION OF THE INVENTION

Figure 1:
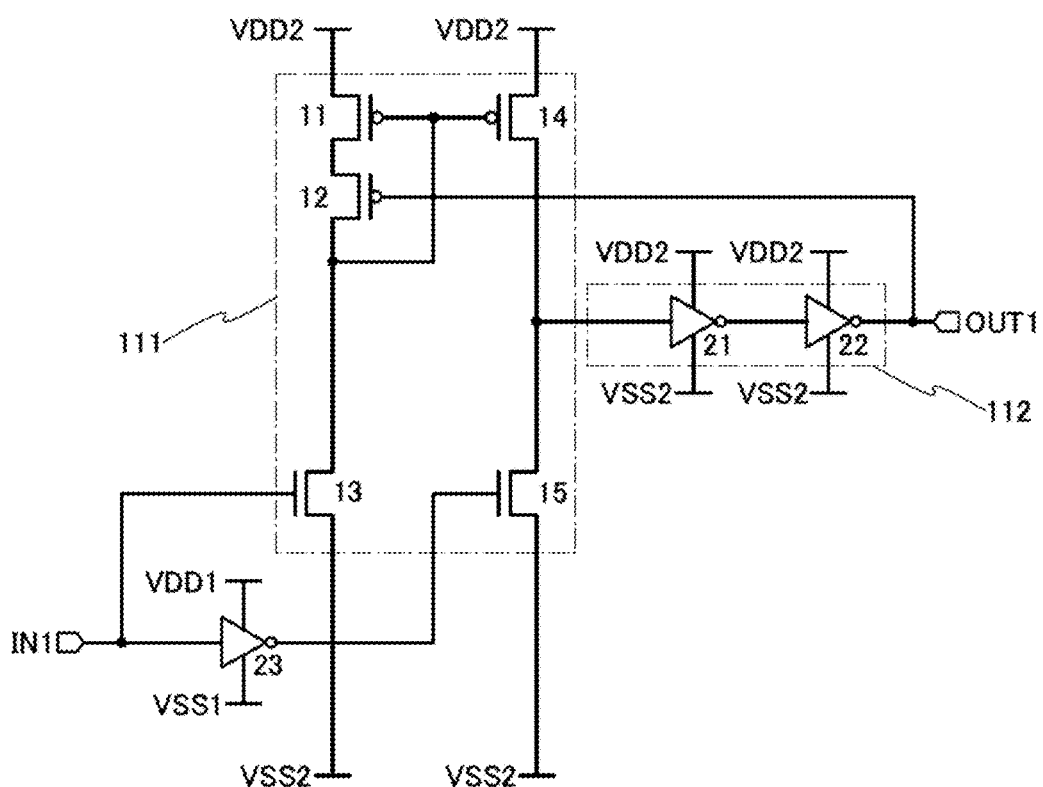
FIG. 1 is a circuit diagram illustrating one embodiment of the present invention.

Embodiments will be hereinafter described with reference to the drawings. Note that the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In this specification and the like, a semiconductor device means a device that utilizes semiconductor characteristics and refers to a circuit including a semiconductor element (e.g., a transistor, a diode, or a photodiode), a device including the circuit, and the like. The semiconductor device also means any device that can function by utilizing semiconductor characteristics. An integrated circuit, a chip including an integrated circuit, and an electronic component including a chip in a package are examples of semiconductor devices. Moreover, a memory device, a display device, a light-emitting device, a lighting device, an electronic device, and the like themselves may be semiconductor devices or may each include a semiconductor device.

In this specification and the like, the description "X and Y are connected" means that X and Y are electrically connected, X and Y are functionally connected, and X and Y are directly connected. Accordingly, without being limited to a predetermined connection relation (e.g., a connection relation shown in drawings or texts), another connection relation is regarded as being included in the drawings or the texts. Each of X and Y denotes an object (e.g., a device, an element, a circuit, a wiring, an electrode, a terminal, a conductive film, or a layer).

A transistor has three terminals: a gate, a source, and a drain. A gate is a node that controls the conduction state of a transistor. Depending on the channel type of a transistor or levels of potentials supplied to the terminals, one of two input/output nodes functions as a source and the other functions as a drain. Therefore, the terms "source" and "drain" can be switched in this specification and the like. In this specification and the like, two terminals except a gate are sometimes referred to as a first terminal and a second terminal or as a third terminal and a fourth terminal.

A node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

A voltage usually refers to a difference in potential between a given potential and a reference potential (e.g., a ground potential (GND) or a source potential). Thus, a voltage can be referred to as a potential. Note that a potential has a relative value; hence, "GND" does not necessarily mean 0 V.

In this specification and the like, ordinal numbers such as "first," "second," and "third" may be used to show the order. Alternatively, ordinal numbers are used to avoid confusion among components in some cases, and do not limit the number of components or the order. For example, it is possible to replace "first" with "second" or "third" in the description of one embodiment of the invention.

Embodiment 1

In this embodiment, a level shift circuit of one embodiment of the present invention will be described with reference to FIGS. 1 to 4, FIGS. 5A and 5B, and FIGS. 6A and 6B.

Configuration Example 1

FIG. 1 illustrates a configuration example of a level shift circuit 110 in one embodiment of the present invention.

The level shift circuit 110 has a function of converting an input signal with an amplitude between a potential VDD1 and a potential VSS1 into an output signal with an amplitude between a potential VDD2 and a potential VSS2. In other words, the level shift circuit 110 has a function of converting an input signal into an output signal with a higher or lower amplitude voltage.

The potential VSS1 is preferably equal to the potential VSS2. Both the potential VSS1 and the potential VSS2 may be a ground potential.

The level shift circuit 110 includes a level shift unit 111 and a buffer circuit 112. Moreover, the level shift circuit 110 includes an input terminal IN1, an inverter circuit 23, and an output terminal OUT1.

The level shift unit 111 includes a transistor 11, a transistor 12, a transistor 13, a transistor 14, and a transistor 15. The transistors 11, 12, and 14 are p-channel transistors, and the transistors 13 and 15 are n-channel transistors.

The buffer circuit 112 includes an inverter circuit 21 and an inverter circuit 22.

One of a source and a drain of the transistor 11 is electrically connected to a wiring to which the potential VDD2 is supplied, and the other of the source and the drain of the transistor 11 is electrically connected to one of a source and a drain of the transistor 12. The other of the source and the drain of the transistor 12 is electrically connected to one of a source and a drain of the transistor 13. The other of the source and the drain of the transistor 13 is electrically connected to a wiring to which the potential VSS2 is supplied.

One of a source and a drain of the transistor 14 is electrically connected to a wiring to which the potential VDD2 is supplied, and the other of the source and the drain of the transistor 14 is electrically connected to one of a source and a drain of the transistor 15. The other of the source and the drain of the transistor 15 is electrically connected to a wiring to which the potential VSS2 is supplied.

A gate of the transistor 11 and a gate of the transistor 14 are electrically connected to the other of the source and the drain of the transistor 12 and the one of the source and the drain of the transistor 13.

A gate of the transistor 13 is electrically connected to the input terminal IN1 and an input terminal of the inverter circuit 23. In other words, the gate of the transistor 13 is electrically connected to a wiring to which an input signal of the level shift circuit 110 is input.

A gate of the transistor 15 is electrically connected to an output terminal of the inverter circuit 23. In other words, the gate of the transistor 15 is electrically connected to a wiring to which an inversion signal of the input signal of the level shift circuit 110 is input.

An input terminal of the inverter circuit 21 is electrically connected to the other of the source and the drain of the transistor 14 and the one of the source and the drain of the transistor 15. An output terminal of the inverter circuit 21 is electrically connected to an input terminal of the inverter circuit 22. An output terminal of the inverter circuit 22 is electrically connected to a gate of the transistor 12 and the output terminal OUT1. In other words, the output terminal of the inverter circuit 22 is electrically connected to the gate of the transistor 12 and a wiring from which an output signal of the level shift circuit 110 is output.

Note that the input terminal of the inverter circuit 21 serves as an input terminal of the buffer circuit 112, and the output terminal of the inverter circuit 22 serves as an output terminal of the buffer circuit 112.

The above is the description of the configuration of the level shift circuit 110.

In the level shift circuit 110, when a low signal is input to the input terminal IN1, first, the transistor 13 is turned off by the potential VSS1 input to the gate of the transistor 13, and the transistor 15 is turned on by the potential VDD1 input to the gate of the transistor 15. When the transistor 15 is turned on, the potential VSS2 is input to the input terminal of the inverter circuit 21; hence, a low signal is output to the output terminal of the inverter circuit 22, and thus, the low signal is input to the output terminal OUT1.

In the level shift circuit 110, when a high signal is input to the input terminal IN1, first, the transistor 13 is turned on by the potential VDD1 input to the gate of the transistor 13, and the transistor 15 is turned off by the potential VSS1 input to the gate of the transistor 15. Next, the potential VSS2 is input to the gate of the transistor 11 and the gate of the transistor 14 since the transistor 13 is turned on, so that the transistors 11 and 14 are turned on. When the transistor 14 is turned on, the potential VDD2 is input to the input terminal of the inverter circuit 21; hence, a high signal is output to the output terminal of the inverter circuit 22, and thus, the high signal is input to the output terminal OUT1.

When a high signal is input to the input terminal IN1, both the transistor 11 and the transistor 13 are turned on, so that a current is likely to flow between the other of the source and the drain of the transistor 11 and the one of the source and the drain of the transistor 13. However, a high signal is output to the output terminal of the inverter circuit 22 at this time, whereby the high signal is also supplied to the gate of the transistor 12 and the transistor 12 is turned off. Thus, a current between the other of the source and the drain of the transistor 11 and the one of the source and the drain of the transistor 13 is interrupted. Consequently, the configuration of the level shift circuit 110 can prevent an increase in power consumption.

By interruption of a current between the other of the source and the drain of the transistor 11 and the one of the source and the drain of the transistor 13, a load on the transistors 11 and 13 can be decreased. Thus, the configuration of the level shift circuit 110 can prevent variations in characteristics of the transistors 11 and 13 and decreases the need to increase the transistor size.

Configuration Example 2

Next, a configuration of a level shift circuit 115 that has the same function as the level shift circuit 110 will be described with reference to FIG. 2.

The level shift circuit 115 differs from the level shift circuit 110 in including a buffer circuit 113 instead of the buffer circuit 112. That is, the level shift circuit 115 includes the level shift unit 111 and the buffer circuit 113. Moreover, the level shift circuit 115 includes the input terminal IN1, the inverter circuit 23, and the output terminal OUT1.

The buffer circuit 113 includes an inverter circuit 24 and an inverter circuit 25. Each of the inverter circuits 24 and 25 is an inverter circuit having two input terminals.

The inverter circuit 24 includes a transistor 16 and a transistor 17. One of a source and a drain of the transistor 16 is electrically connected to one of a source and a drain of the transistor 17.

The inverter circuit 25 includes a transistor 18 and a transistor 19. One of a source and a drain of the transistor 18 is electrically connected to one of a source and a drain of the transistor 19.

The transistors 16 and 18 are p-channel transistors, and the transistors 17 and 19 are n-channel transistors.

A gate of the transistor 16 serves as a first input terminal of the inverter circuit 24. A gate of the transistor 17 serves as a second input terminal of the inverter circuit 24. A terminal that is electrically connected to the one of the source and the drain of the transistor 16 and the one of the source and the drain of the transistor 17 serves as an output terminal of the inverter circuit 24.

A gate of the transistor 18 serves as a first input terminal of the inverter circuit 25. A gate of the transistor 19 serves as a second input terminal of the inverter circuit 25. A terminal that is electrically connected to the one of the source and the drain of the transistor 18 and the one of the source and the drain of the transistor 19 serves as an output terminal of the inverter circuit 25.

The level shift unit 111 included in the level shift circuit 115 has the same configuration as the level shift unit 111 included in the level shift circuit 110. The description of the level shift unit 111 included in the level shift circuit 110 can be referred to for the level shift unit 111 included in the level shift circuit 115.

The gate of the transistor 16, which serves as the first input terminal of the inverter circuit 24, is electrically connected to the other of the source and the drain of the transistor 14 and the one of the source and the drain of the transistor 15. The gate of the transistor 17, which serves as the second input terminal of the inverter circuit 24, is electrically connected to the input terminal IN1.

The gate of the transistor 18, which serves as the first input terminal of the inverter circuit 25, is electrically connected to the output terminal of the inverter circuit 24. The gate of the transistor 19, which serves as the second input terminal of the inverter circuit 25, is electrically connected to the output terminal of the inverter circuit 23. The output terminal of the inverter circuit 25 is electrically connected to the gate of the transistor 12 and the output terminal OUT1. In other words, the output terminal of the inverter circuit 25 is electrically connected to the gate of the transistor 12 and a wiring from which an output signal of the level shift circuit 115 is output.

It can be said that the gate of the transistor 16 also serves as an input terminal of the buffer circuit 113, and the output terminal of the inverter circuit 25 also serves as an output terminal of the buffer circuit 113.

The above is the description of the configuration of the level shift circuit 115.

In the level shift circuit 115, when a low signal is input to the input terminal IN1, first, the transistor 13 is turned off by the potential VSS1 input to the gate of the transistor 13, the transistor 15 is turned on by the potential VDD1 input to the gate of the transistor 15, the transistor 17 is turned off by the potential VSS1 input to the gate of the transistor 17, and the transistor 19 is turned on by the potential VDD1 input to the gate of the transistor 19.

Next, since the transistor 15 is turned on, the potential VSS2 is input to the gate of the transistor 16, so that the transistor 16 is turned on. Then, the potential VDD2 is input to the gate of the transistor 18, so that the transistor 18 is turned off. Thus, the potential VSS2 is output from the output terminal of the inverter circuit 25. That is, a low signal is output to the output terminal OUT1.

Meanwhile, in the level shift circuit 115, when a high signal is input to the input terminal IN1, first, the transistor 13 is turned on by the potential VDD1 input to the gate of the transistor 13, the transistor 15 is turned off by the potential VSS1 input to the gate of the transistor 15, the transistor 17 is turned on by the potential VDD1 input to the gate of the transistor 17, and the transistor 19 is turned off by the potential VSS1 input to the gate of the transistor 19.

Next, since the transistor 13 is turned on, the potential VSS2 is input to the gate of the transistor 11 and the gate of the transistor 14, so that the transistors 11 and 14 are turned on. When the transistor 14 is turned on, the potential VDD2 is input to the gate of the transistor 16.

Then, by input of the potential VDD2 to the gate of the transistor 16, the transistor 16 is turned off; hence, the potential VSS2 is supplied to the gate of the transistor 18. Thus, the transistor 18 is turned on, so that the potential VDD2 is output from the output terminal of the inverter circuit 25. That is, a high signal is output to the output terminal OUT1.

When a high signal is input to the input terminal IN1, both the transistor 11 and the transistor 13 are turned on, so that a current is likely to flow between the other of the source and the drain of the transistor 11 and the one of the source and the drain of the transistor 13. However, a high signal is output to the output terminal of the inverter circuit 25 at this time, whereby the high signal is also supplied to the gate of the transistor 12 and the transistor 12 is turned off. Thus, a current between the other of the source and the drain of the transistor 11 and the one of the source and the drain of the transistor 13 is interrupted. Consequently, the configuration of the level shift circuit 115 can prevent an increase in power consumption.

By interruption of a current between the other of the source and the drain of the transistor 11 and the one of the source and the drain of the transistor 13, a load on the transistors 11 and 13 can be decreased. Thus, the configuration of the level shift circuit 115 can prevent variations in characteristics of the transistors 11 and 13 and decreases the need to increase the transistor size.

Figure 2:
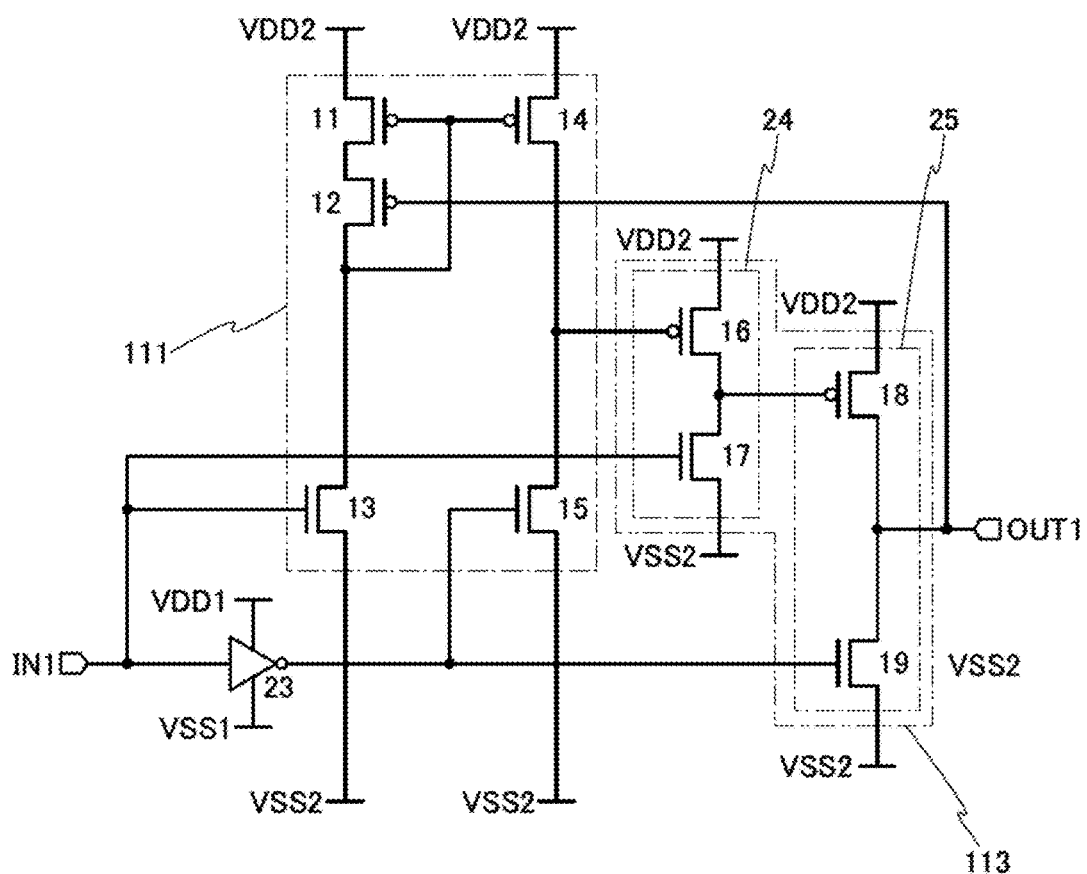
FIG. 2 is a circuit diagram illustrating one embodiment of the present invention.

Compared to the level shift circuit 110 in FIG. 1, the level shift circuit 115 in FIG. 2, which includes the buffer circuit 113 (the inverter circuits 24 and 25), enables amplification of an output signal and more stable operation.

For example, the assumption is made that a potential input to the gate of the transistor 16 is not sufficiently decreased when an input signal input to the input terminal IN1 is changed from a high signal to a low signal. Even in such a case, a low signal is input to the gate of the transistor 17 from the input terminal IN1; thus, the transistor 17 is properly turned off. Consequently, it becomes easy to input a high signal to the gate of the transistor 18.

As another example, the assumption is made that a potential input to the gate of the transistor 18 is not sufficiently decreased when an input signal input to the input terminal IN1 is changed from a low signal to a high signal. Even in such a case, a low signal is input to the gate of the transistor 19 from the output terminal of the inverter circuit 23; thus, the transistor 19 is properly turned off, and it becomes easy for the inverter circuit 24 to output a high signal.

Accordingly, by employing the configuration of the buffer circuit 113, the level shift circuit 115 can amplify a signal input to the buffer circuit 113 and output the amplified signal. As a result, the level shift circuit 115 can operate more stably.

Figure 6A:
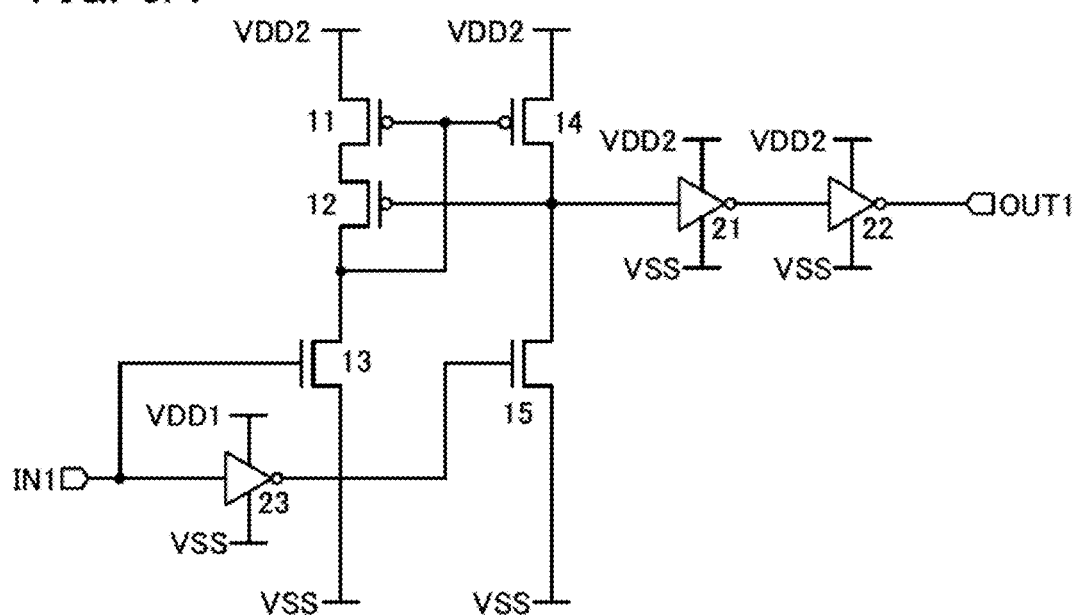
FIGS. 6A and 6B are circuit diagrams each illustrating a level shift circuit.

Here, as a comparative example for the level shift circuit 110 and the level shift circuit 115, a level shift circuit in which the gate of the transistor 12 is connected to the input terminal of the inverter circuit 21 is assumed (see FIG. 6A). In each of the level shift circuit 110, the level shift circuit 115, and the level shift circuit illustrated in FIG. 6A, it is preferred that the transistor 12 be turned on when a signal input to the input terminal IN1 is changed from a high signal to a low signal.

However, in the level shift circuit of FIG. 6A, when a signal input to the input terminal IN1 is changed from a high signal to a low signal, the decrease of a potential supplied to the gate of the transistor 12 is sometimes not sufficient to turn on the transistor 12. In such a case, the level shift circuit of FIG. 6A cannot operate sometimes because the transistor 12 is not turned on.

On the other hand, in the level shift circuit 110, a signal output from the output terminal of the buffer circuit 112 is more amplified than a signal input to the input terminal of the buffer circuit 112 (i.e., the input terminal of the inverter circuit 21). Thus, when a signal input to the input terminal IN1 is changed from a high signal to a low signal in the level shift circuit 110, a potential supplied to the gate of the transistor 12 is likely to decrease enough to turn on the transistor 12. It can therefore be said that the level shift circuit 110 is likely to operate more stably than the level shift circuit of FIG. 6A.

Furthermore, in the level shift circuit 115, a signal output from the output terminal of the buffer circuit 113 is more amplified than a signal input to the input terminal of the buffer circuit 113. Thus, when a signal input to the input terminal IN1 is changed from a high signal to a low signal in the level shift circuit 115, a potential supplied to the gate of the transistor 12 is likely to decrease enough to turn on the transistor 12. It can therefore be said that the level shift circuit 115 is likely to operate more stably than the level shift circuit of FIG. 6A.

Figure 6B:
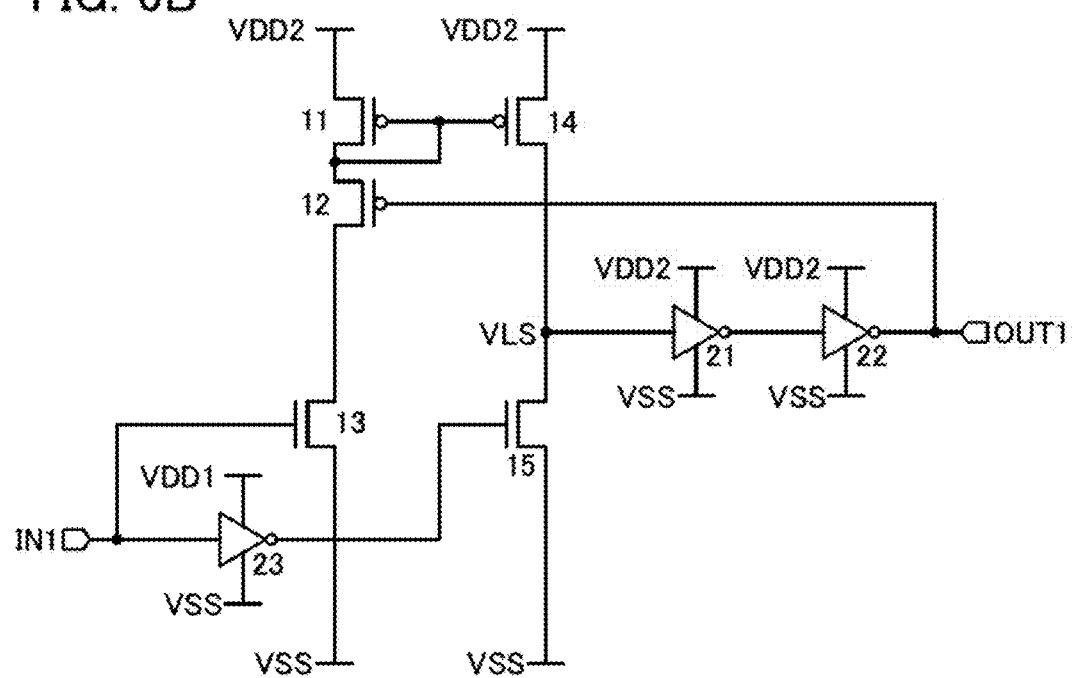

Next, as another comparative example for the level shift circuit 110 and the level shift circuit 115, the assumption is made that the gate of the transistor 11 and the gate of the transistor 14 are connected to the other of the source and the drain of the transistor 11 and the one of the source and the drain of the transistor 12 as in a level shift circuit illustrated in FIG. 6B. In FIG. 6B, a node that is electrically connected to the other of the source and the drain of the transistor 14, the one of the source and the drain of the transistor 15, and the input terminal of the inverter circuit 21 is referred to as a node VLS.

In the level shift circuit of FIG. 6B, when a high signal is input to the input terminal IN1 and a high signal is output to the output terminal of the inverter circuit 22, the transistor 12 is turned off as in the level shift circuit 110; hence, a current between the other of the source and the drain of the transistor 11 and the one of the source and the drain of the transistor 13 is interrupted. However, a potential supplied to the gate of the transistor 11 and the gate of the transistor 14 becomes undefined when the transistor 12 is turned off; thus, a potential of the node VLS becomes undefined.

When the potential of the node VLS becomes undefined, a shoot-through current is likely to be generated in the inverter circuit 21 or the inverter circuit 22; thus, power consumption is likely to increase. Furthermore, when the potential of the node VLS becomes undefined, a signal whose logic is inverted with respect to that of a signal input to the input terminal IN1 might be output from the output terminal OUT1 because of adverse effects of noise from the vicinity of the level shift circuit.

Noise from the vicinity of the level shift circuit may be sometimes generated, for example, by capacitive coupling between a wiring included in the level shift circuit and a surrounding wiring close to the wiring, or by unstable operation of the transistor 15 caused when the values of the potential VSS1 and the potential VSS2 become different from each other.

On the other hand, in the level shift circuits 110 and 115, the transistor 12 is connected between the other of the source and the drain of the transistor 11 and the one of the source and the drain of the transistor 13. Thus, the transistors 11 and 14 are on even when the transistor 12 is off; hence, the potential VDD2 can be input to the input terminal of the buffer circuit.

Accordingly, the level shift circuits 110 and 115 can prevent a potential input to the input terminal of the buffer circuit from being undefined. Thus, a shoot-through current can be prevented from being generated in the buffer circuit, resulting in lower power consumption. In addition, even if there is noise from the vicinity of the level shift circuit, the level shift circuits 110 and 115 can prevent output of a signal whose logic is inverted with respect to that of an input signal input to the input terminal IN1. Consequently, the level shift circuits 110 and 115 can operate stably.

In the level shift circuit of FIG. 6B, since the transistor 12 is turned off when a high signal is input to the input terminal IN1, charge is likely to remain in a wiring connected to the gate of the transistor 11 and the gate of the transistor 14. This remaining charge may sometimes cause a malfunction of the level shift circuit when an input signal input to the input terminal IN1 is changed from a high signal to a low signal.

On the other hand, in the level shift circuits 110 and 115, charge is less likely to remain in a wiring connected to the gate of the transistor 11 and the gate of the transistor 14 even if the transistor 12 is turned off when a high signal is input to the input terminal IN1. Thus, the level shift circuits 110 and 115 can operate stably.

Furthermore, as described above, the transistor 12 in each of the level shift circuits 110 and 115 is connected between the other of the source and the drain of the transistor 11 and the one of the source and the drain of the transistor 13. The gate of the transistor 12 is electrically connected to the output terminal of the buffer circuit and the output terminal OUT1. Thus, when a high signal is input to the input terminal IN1 and a high signal is output to the output terminal of the buffer circuit, the transistor 12 can be turned off to interrupt a current between the other of the source and the drain of the transistor 11 and the one of the source and the drain of the transistor 13, while the output signal is kept stable. As a result, a load on the transistors 11 and 13 can be decreased, preventing deterioration of the transistors 11 and 13.

Consequently, the level shift circuits 110 and 115 can operate stably even when characteristics of transistors are unstable for a process reason and the transistors are likely to deteriorate or when noise from the vicinity of the level shift circuit is large.

In view of the above, even when characteristics of transistors are expected to vary, the level shift circuits 110 and 115 are capable of operating stably without making the size of n-channel transistors larger than that of p-channel transistors. Thus, the configurations of the level shift circuits 110 and 115 can decrease the need for increasing the transistor size.

Moreover, the configurations of the level shift circuits 110 and 115 can prevent occurrence of problems such as increase in delay time, increase in current, and increase in area.

Configuration Example 3

Next, a level shift circuit 120 that is a modified example of the level shift circuit 110 will be described with reference to FIG. 3.

Like the level shift circuit 110, the level shift circuit 120 has a function of converting an input signal with an amplitude between the potential VDD1 and the potential VSS1 into an output signal with an amplitude between the potential VDD2 and the potential VSS2. In other words, the level shift circuit 120 has a function of converting an input signal into an output signal with a higher or lower amplitude voltage.

The level shift circuit 120 differs from the level shift circuit 110 in having a function of outputting an inversion signal of an output signal.

The level shift circuit 120 includes a level shift unit 121, a level shift unit 122, an inverter circuit 41, and an inverter circuit 42. Moreover, the level shift circuit 120 includes an input terminal IN2, an inverter circuit 43, an output terminal OUT2, and an output terminal OUT2B.

The potential VSS1 is preferably equal to the potential VSS2. Both the potential VSS1 and the potential VSS2 may be a ground potential.

The output terminal OUT2B is a terminal to which an inversion signal of an output signal output to the output terminal OUT2 is output.

The level shift unit 121 includes a transistor 31, a transistor 32, a transistor 33, a transistor 34, and a transistor 35. The level shift unit 122 includes a transistor 36, a transistor 37, a transistor 38, a transistor 39, and a transistor 40.

The transistors 31, 32, 34, 36, 37, and 39 are p-channel transistors. The transistors 33, 35, 38, and 40 are n-channel transistors.

One of a source and a drain of the transistor 31 is electrically connected to a wiring to which the potential VDD2 is supplied, and the other of the source and the drain of the transistor 31 is electrically connected to one of a source and a drain of the transistor 32. The other of the source and the drain of the transistor 32 is electrically connected to one of a source and a drain of the transistor 33. The other of the source and the drain of the transistor 33 is electrically connected to a wiring to which the potential VSS2 is supplied.

One of a source and a drain of the transistor 34 is electrically connected to a wiring to which the potential VDD2 is supplied, and the other of the source and the drain of the transistor 34 is electrically connected to one of a source and a drain of the transistor 35. The other of the source and the drain of the transistor 35 is electrically connected to a wiring to which the potential VSS2 is supplied.

A gate of the transistor 31 and a gate of the transistor 34 are electrically connected to the other of the source and the drain of the transistor 32 and the one of the source and the drain of the transistor 33.

One of a source and a drain of the transistor 36 is electrically connected to a wiring to which the potential VDD2 is supplied, and the other of the source and the drain of the transistor 36 is electrically connected to one of a source and a drain of the transistor 37. The other of the source and the drain of the transistor 37 is electrically connected to one of a source and a drain of the transistor 38. The other of the source and the drain of the transistor 38 is electrically connected to a wiring to which the potential VSS2 is supplied.

One of a source and a drain of the transistor 39 is electrically connected to a wiring to which the potential VDD2 is supplied, and the other of the source and the drain of the transistor 39 is electrically connected to one of a source and a drain of the transistor 40. The other of the source and the drain of the transistor 40 is electrically connected to a wiring to which the potential VSS2 is supplied.

A gate of the transistor 36 and a gate of the transistor 39 are electrically connected to the other of the source and the drain of the transistor 37 and the one of the source and the drain of the transistor 38.

Figure 3:
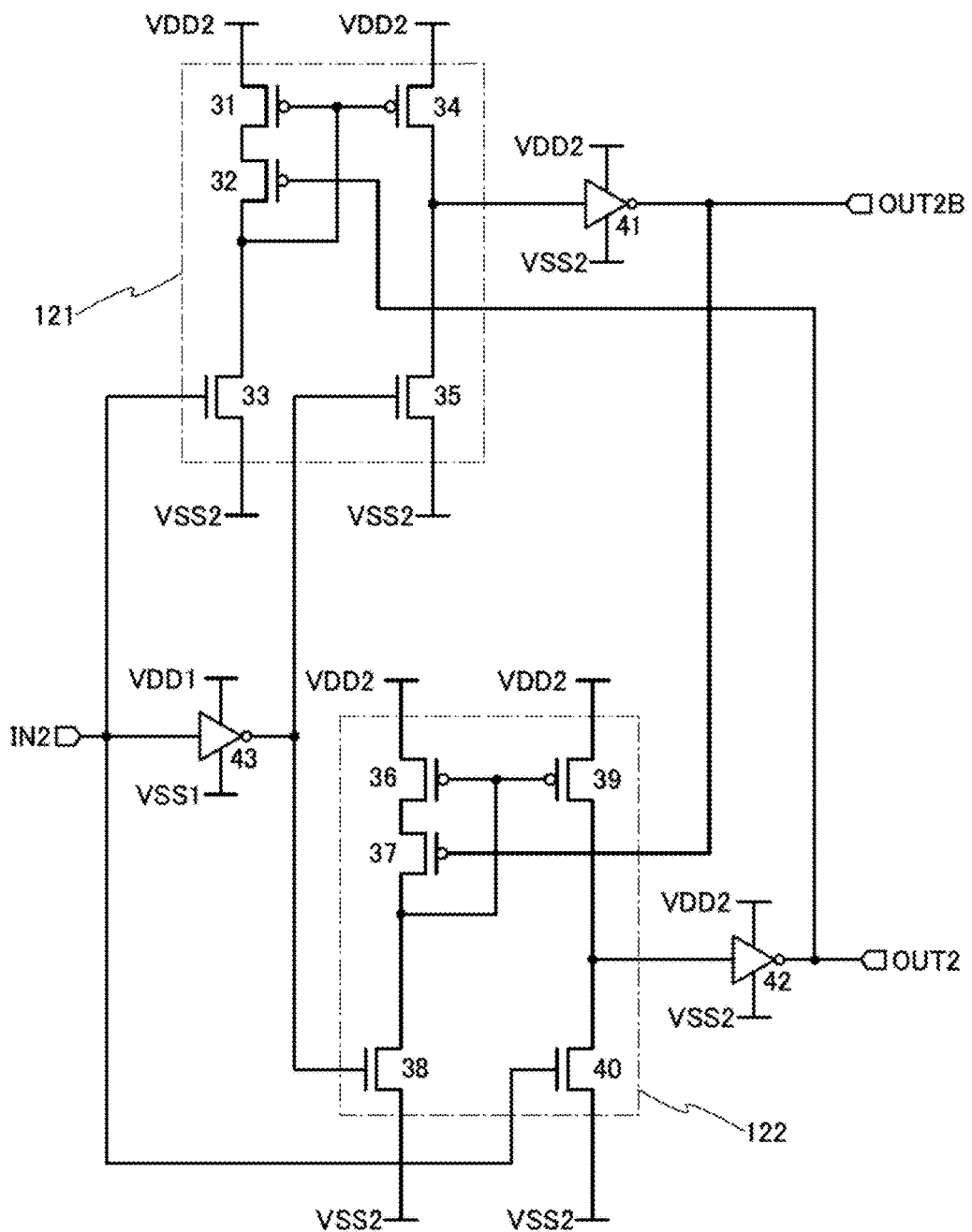
FIG. 3 is a circuit diagram illustrating one embodiment of the present invention.

In FIG. 3, a gate of the transistor 33 and a gate of the transistor 40 are electrically connected to the input terminal IN2. In other words, the gate of the transistor 33 and the gate of the transistor 40 are electrically connected to a wiring to which an input signal of the level shift circuit 120 is input.

The input terminal IN2 is electrically connected to an input terminal of the inverter circuit 43. A gate of the transistor 35 and a gate of the transistor 38 are electrically connected to an output terminal of the inverter circuit 43. In other words, the gate of the transistor 35 and the gate of the transistor 38 are electrically connected to a wiring to which an inversion signal of the input signal of the level shift circuit 120 is input.

An input terminal of the inverter circuit 41 is electrically connected to the other of the source and the drain of the transistor 34 and the one of the source and the drain of the transistor 35. An output terminal of the inverter circuit 41 is electrically connected to the output terminal OUT2B and a gate of the transistor 37.

An input terminal of the inverter circuit 42 is electrically connected to the other of the source and the drain of the transistor 39 and the one of the source and the drain of the transistor 40. An output terminal of the inverter circuit 42 is electrically connected to a gate of the transistor 32 and the output terminal OUT2.

The above is the description of the configuration of the level shift circuit 120.

In the level shift circuit 120, when a low signal is input to the input terminal IN2, first, the transistor 33 is turned off by the potential VSS1 input to the gate of the transistor 33, the transistor 35 is turned on by the potential VDD1 input to the gate of the transistor 35, the transistor 38 is turned on by the potential VDD1 input to the gate of the transistor 38, and the transistor 40 is turned off by the potential VSS1 input to the gate of the transistor 40.

Then, in the level shift unit 121, the potential VSS2 is input to the input terminal of the inverter circuit 41 because the transistor 35 is turned on; thus, a high signal is input to the output terminal OUT2B.

At the same time, in the level shift unit 122, the potential VSS2 is input to the gate of the transistor 36 and the gate of the transistor 39 because the transistor 38 is turned on; hence, the transistors 36 and 39 are turned on. Moreover, since the transistor 39 is turned on, the potential VDD2 is input to the input terminal of the inverter circuit 42, so that a low signal is input to the output terminal OUT2.

Meanwhile, in the level shift circuit 120, when a high signal is input to the input terminal IN2, first, the transistor 33 is turned on by the potential VDD1 input to the gate of the transistor 33, the transistor 35 is turned off by the potential VSS1 input to the gate of the transistor 35, the transistor 38 is turned off by the potential VSS1 input to the gate of the transistor 38, and the transistor 40 is turned on by the potential VDD1 input to the gate of the transistor 40.

Then, in the level shift unit 121, the potential VSS2 is input to the gate of the transistor 31 and the gate of the transistor 34 because the transistor 33 is turned on; hence, the transistors 31 and 34 are turned on. Moreover, since the transistor 34 is turned on, the potential VDD2 is input to the input terminal of the inverter circuit 41, so that a low signal is input to the output terminal OUT2B.

At the same time, in the level shift unit 122, the potential VSS2 is input to the input terminal of the inverter circuit 42 because the transistor 40 is turned on; thus, a high signal is input to the output terminal OUT2.

When a high signal is input to the input terminal IN2, a high signal is output to the output terminal of the inverter circuit 42; hence, the high signal is supplied to the gate of the transistor 32 and the transistor 32 is turned off as a result. Thus, a current between the other of the source and the drain of the transistor 31 and the one of the source and the drain of the transistor 33 is interrupted. Consequently, a load on the transistors 31 and 33 can be decreased, preventing deterioration of the transistors 31 and 33.

When a low signal is input to the input terminal IN2, a high signal is output to the output terminal of the inverter circuit 41; hence, the high signal is supplied to the gate of the transistor 37 and the transistor 37 is turned off as a result. Thus, a current between the other of the source and the drain of the transistor 36 and the one of the source and the drain of the transistor 38 is interrupted. Consequently, a load on the transistors 36 and 38 can be decreased, preventing deterioration of the transistors 36 and 38.

The level shift circuit 120 includes the level shift unit 121 and the level shift unit 122 to which an inversion signal of a signal input to the level shift unit 121 is input. Accordingly, even if one of the level shift units 121 and 122 malfunctions, the other of the level shift units 121 and 122 operates normally and outputs an output signal, whereby the on/off state of the transistor 32 or the transistor 37 in the one of the level shift units 121 and 122 is properly switched.

As an example, a method for operating the level shift circuit 120 will be described on the assumption that the level shift unit 121 and the level shift unit 122 are likely to malfunction when an input signal is changed from a high signal to a low signal. First, a high signal is input to the input terminal IN2. At this time, the high signal is input to the level shift unit 121, and a low signal is input to the level shift unit 122. Moreover, a high signal is output to the output terminal OUT2, and a low signal is output to the output terminal OUT2B.

Next, a signal input to the input terminal IN2 is changed from a high signal to a low signal. At this time, a signal input to the level shift unit 121 is changed from a high signal to a low signal, so that the level shift unit 121 is likely to malfunction. Meanwhile, the level shift unit 122 does not malfunction when a signal input to the level shift unit 122 is changed from a low signal to a high signal. Thus, a signal output to the input terminal of the inverter circuit 42 is changed from a low signal to a high signal, and a signal output to the output terminal OUT2 is changed from a high signal to a low signal.

When a signal output to the output terminal OUT2 is changed from a high signal to a low signal, a low signal is supplied to the gate of the transistor 32, and thus the transistor 32 can be turned on. Consequently, the transistor 31 and the transistor 34 can be turned off, whereby the logic of the level shift unit 121 is fixed and a low signal can be output to the output terminal OUT2B.

Accordingly, it can be said that the level shift circuit 120 is likely to operate normally even if one of the level shift units 121 and 122 malfunctions. Although the operation method for the case where the level shift unit 121 malfunctions and the level shift unit 122 operates normally is described here, the method for operating the level shift circuit 120 is not limited to this. The level shift circuit 120 can operate normally also when the level shift unit 122 malfunctions and the level shift unit 121 operates normally.

Therefore, the level shift circuit 120 can operate stably even when deterioration of transistors is likely to be caused by unstable transistor characteristics due to a process factor or when one of the level shift units 121 and 122 is likely to malfunction.

In view of the above, even when characteristics of transistors are expected to vary, the level shift circuit 120 is capable of operating stably without making the size of n-channel transistors larger than that of p-channel transistors. Thus, the configuration of the level shift circuit 120 can decrease the need for increasing the transistor size.

Moreover, the configuration of the level shift circuit 120 can prevent occurrence of problems such as increase in delay time and increase in current.

Configuration Example 4

Figure 4:
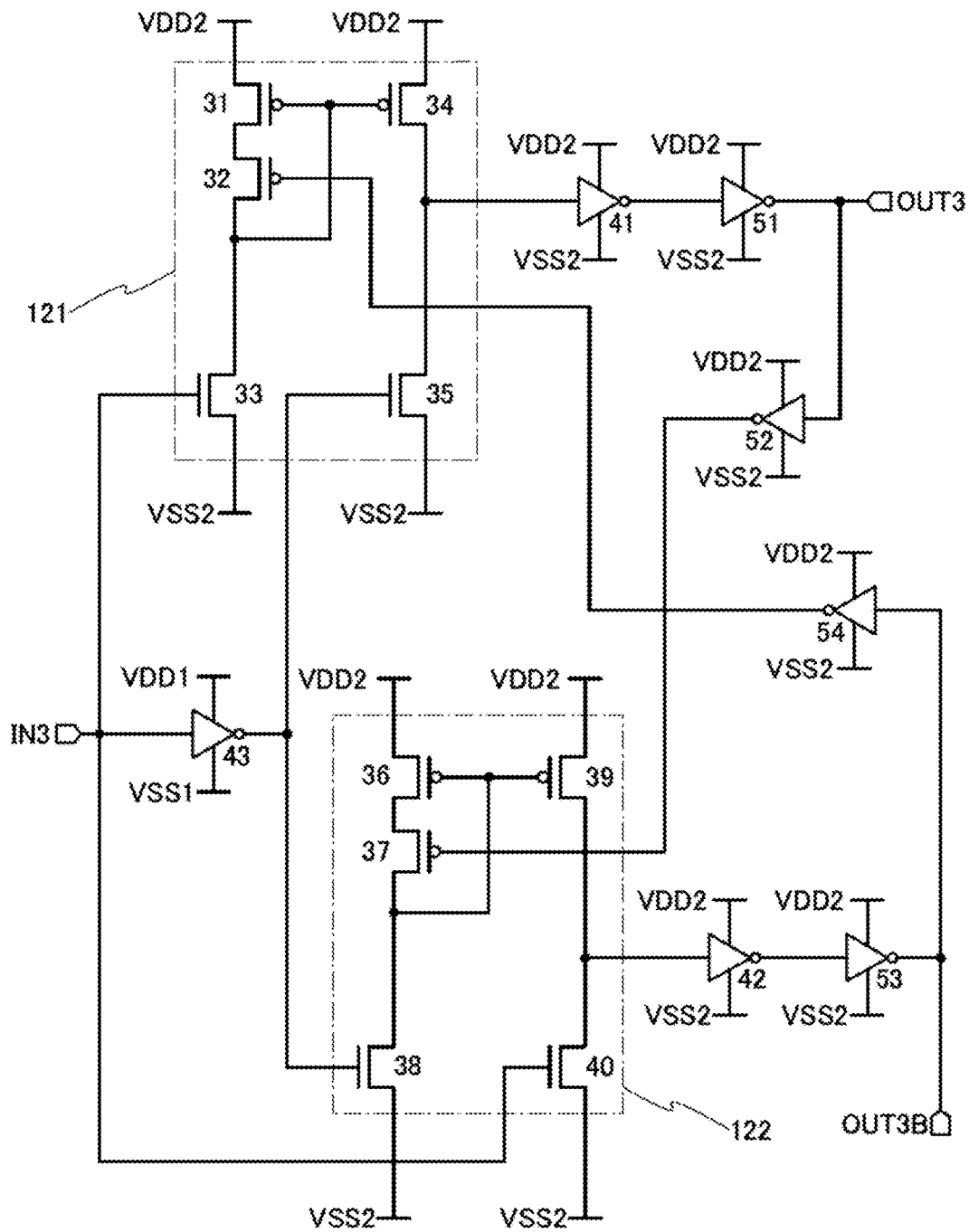
FIG. 4 is a circuit diagram illustrating one embodiment of the present invention.

An inverter circuit may be added to the level shift circuit 120. FIG. 4 illustrates a level shift circuit 130 that includes an inverter circuit 51, an inverter circuit 52, an inverter circuit 53, and an inverter circuit 54 in addition to the components of the level shift circuit 120.

The level shift circuit 130 includes the level shift unit 121, the level shift unit 122, the inverter circuit 41, the inverter circuit 42, the inverter circuit 43, the inverter circuit 51, the inverter circuit 52, the inverter circuit 53, and the inverter circuit 54. Moreover, the level shift circuit 130 has an input terminal IN3, an output terminal OUT3, and an output terminal OUT3B.

The output terminal OUT3B is a terminal to which an inversion signal of an output signal output to the output terminal OUT3 is output.

The level shift unit 121 included in the level shift circuit 130 includes the transistor 31, the transistor 32, the transistor 33, the transistor 34, and the transistor 35. The level shift unit 122 included in the level shift circuit 130 includes the transistor 36, the transistor 37, the transistor 38, the transistor 39, and the transistor 40.

The description of the level shift unit 121 and the level shift unit 122 included in the level shift circuit 120 can be referred to for the level shift unit 121 and the level shift unit 122 included in the level shift circuit 130.

The input terminal of the inverter circuit 41 in the level shift circuit 130 is electrically connected to the other of the source and the drain of the transistor 34 and the one of the source and the drain of the transistor 35. The output terminal of the inverter circuit 41 in the level shift circuit 130 is electrically connected to an input terminal of the inverter circuit 51.

An output terminal of the inverter circuit 51 is electrically connected to an input terminal of the inverter circuit 52 and the output terminal OUT3.

An output terminal of the inverter circuit 52 is electrically connected to the gate of the transistor 37.

The input terminal of the inverter circuit 42 in the level shift circuit 130 is electrically connected to the other of the source and the drain of the transistor 39 and the one of the source and the drain of the transistor 40. The output terminal of the inverter circuit 42 in the level shift circuit 130 is electrically connected to an input terminal of the inverter circuit 53.

An output terminal of the inverter circuit 53 is electrically connected to an input terminal of the inverter circuit 54 and the output terminal OUT3B.

An output terminal of the inverter circuit 54 is electrically connected to the gate of the transistor 32.

The above is the description of the configuration of the level shift circuit 130.

In the level shift circuit 130, when a high signal is input to the input terminal IN3, a high signal is output to the output terminal OUT3 and a low signal is output to the output terminal OUT3B. Meanwhile, in the level shift circuit 130, when a low signal is input to the input terminal IN3, a low signal is output to the output terminal OUT3 and a high signal is output to the output terminal OUT3B.

When a high signal is input to the input terminal IN3, a high signal is output to the output terminal of the inverter circuit 51, whereby the transistor 37 is turned off. Thus, a current between the other of the source and the drain of the transistor 36 and the one of the source and the drain of the transistor 38 can be interrupted. As a result, a load on the transistors 36 and 38 can be decreased, preventing deterioration of the transistors 36 and 38.

When a low signal is input to the input terminal IN3, a high signal is output to the output terminal of the inverter circuit 53, whereby the transistor 32 is turned off. Thus, a current between the other of the source and the drain of the transistor 31 and the one of the source and the drain of the transistor 33 can be interrupted. As a result, a load on the transistors 31 and 33 can be decreased, preventing deterioration of the transistors 31 and 33.

Consequently, the level shift circuit 130 can operate stably even when characteristics of transistors are unstable for a process reason and the transistors are likely to deteriorate or when noise from the vicinity of the level shift circuit is large.

In the level shift circuits 110, 115, 120, and 130 described above, the n-channel transistor may be a transistor whose channel is formed using an oxide semiconductor (hereinafter referred to as OS transistor). As shown in FIG. 5B, an OS transistor can be formed over a layer including a transistor whose channel formation region contains silicon (hereinafter referred to as Si transistor), which is preferable because the area of the level shift circuit can be reduced.

An example of a circuit including both a Si transistor and an OS transistor is described with reference to FIGS. 5A and 5B. A circuit diagram in FIG. 5A shows a configuration of a CMOS inverter in which a p-channel Si transistor 2200 and an n-channel OS transistor 2100 are connected to each other in series and gates of them are connected to each other.

Figure 5A:
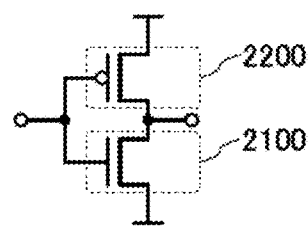
FIGS. 5A and 5B are a circuit diagram and a cross-sectional view illustrating one embodiment of the present invention.
Figure 5B:
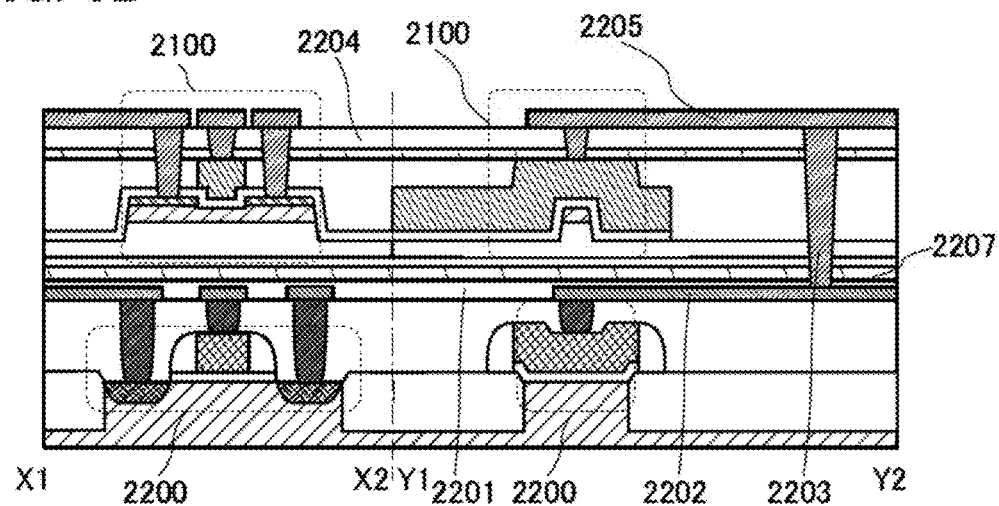

FIG. 5B is a cross-sectional view of a semiconductor device including the CMOS inverter illustrated in FIG. 5A. In FIG. 5B, the cross section X1-X2 shows a channel length direction, and the cross section Y1-Y2 shows a channel width direction. The semiconductor device in FIG. 5B includes the Si transistor 2200 in a lower portion and the OS transistor 2100 in an upper portion. Note that a cross-sectional view of the transistors in the channel length direction is on the left side of a dashed-dotted line, and a cross-sectional view of the transistors in the channel width direction is on the right side of the dashed-dotted line.

FIG. 5B illustrates a structure in which the OS transistor 2100 is provided over the Si transistor 2200 with an insulator 2201 and an insulator 2207 placed therebetween. A plurality of wirings 2202 are provided between the Si transistor 2200 and the OS transistor 2100. Furthermore, wirings and electrodes provided over and under the insulators are electrically connected to each other through a plurality of plugs 2203 embedded in the insulators. An insulator 2204 covering the OS transistor 2100 and a wiring 2205 over the insulator 2204 are provided.

An oxide semiconductor that can be used for a transistor will be described in detail in Embodiment 2.

In a process of forming an OS transistor over a layer including a Si transistor, variation in characteristics of the Si transistor due to some step for forming the OS transistor is sometimes expected depending on conditions. In such a case, the increase in size of the n-channel OS transistor in a level shift circuit may be required in some instances.

However, as described above, even when characteristics of p-channel transistors are expected to vary, the level shift circuits 110, 115, 120, and 130 are capable of operating stably without making the size of the n-channel transistors larger than that of the p-channel transistors.

Therefore, when Si transistors are used as the p-channel transistors and OS transistors are used as the n-channel transistors in the level shift circuits 110, 115, 120, and 130, a layer including the n-channel transistors can be formed over a layer including the p-channel transistors and in addition, the need to make the size of the n-channel transistors larger than that of the p-channel transistors is decreased. For these reasons, the area of the level shift circuits 110, 115, 120, and 130 can be reduced.

At least part of this embodiment can be implemented in combination with any of the other embodiments described in this specification as appropriate.

Embodiment 2

This embodiment will show a display device that can employ any of the level shift circuits described in Embodiment 1. The display device shown below includes a reflective liquid crystal element and a light-emitting element and can display images both in a transmissive mode and in a reflective mode.

[Structure Example]

FIG. 10A is a block diagram illustrating an example of the structure of a display device 400. The display device 400 includes a plurality of pixels 410 that are arranged in a matrix in a display portion 362. The display device 400 also includes a circuit GD and a circuit SD. In addition, the display device 400 includes a plurality of wirings G1, a plurality of wirings G2, a plurality of wirings ANO, and a plurality of wirings CSCOM; these wirings are electrically connected to the circuit GD and the pixels 410 arranged in a direction R. Moreover, the display device 400 includes a plurality of wirings S1 and a plurality of wirings S2 that are electrically connected to the circuit SD and the pixels 410 arranged in a direction C.

Although the display device includes one circuit GD and one circuit SD here for simplification, the circuit GD and the circuit SD for driving liquid crystal elements and the circuit GD and the circuit SD for driving light-emitting elements may be provided separately.

Figure 7:
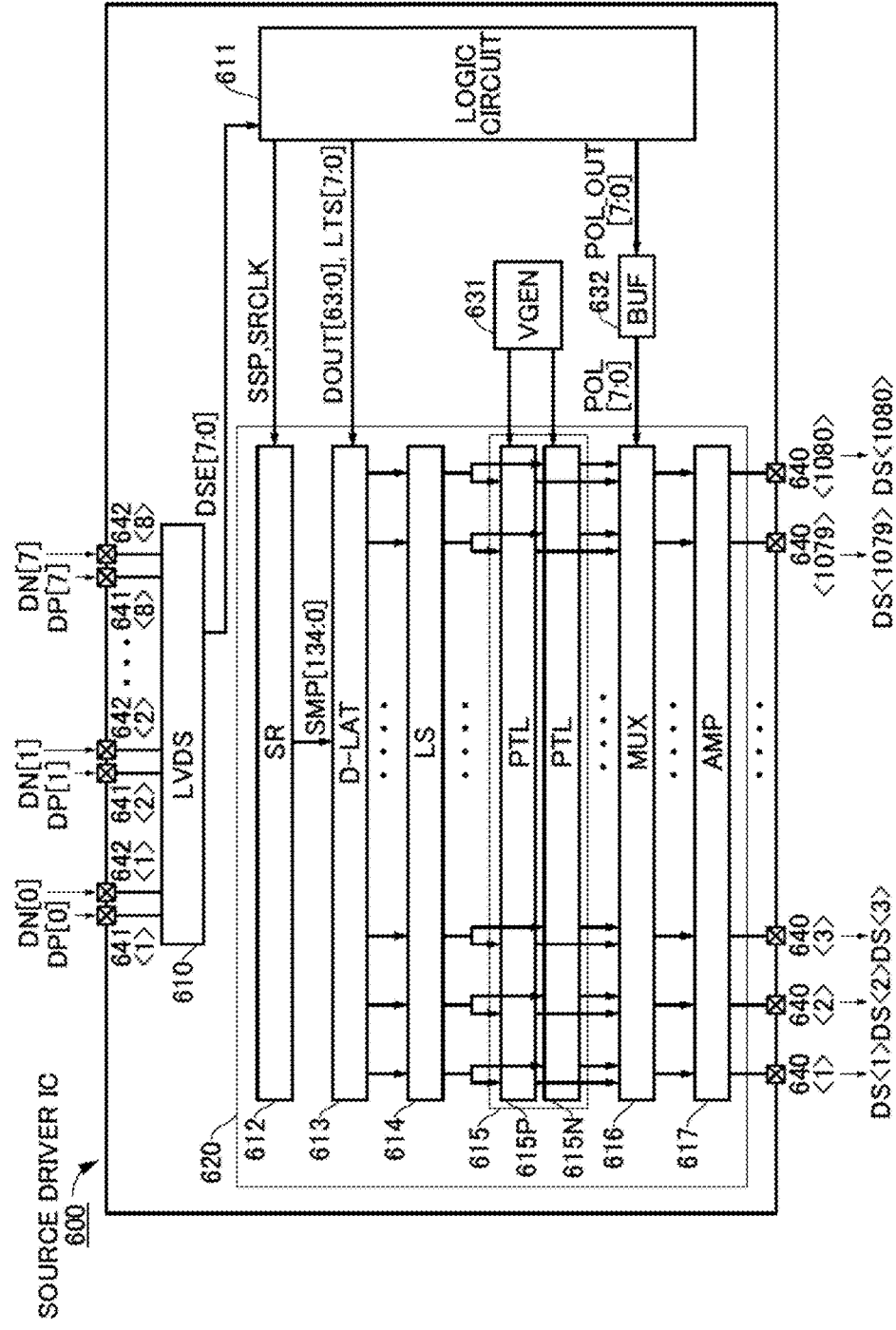
FIG. 7 is a block diagram illustrating a structure example of a source driver IC.

In the circuit SD, the level shift circuit of one embodiment of the present invention can be used. A structure example of a source driver IC 600 that can be used as the circuit SD is described with reference to FIG. 7.

Here, for easy understanding of this embodiment, the specifications of the source driver IC 600 are set as follows. An image signal transmitted to the source driver IC 600 is an 8-bit serial digital signal. Data of an 8-bit digital signal represents a gray level. Image signals are transmitted with differential signaling. One of differential image signals is an image signal DP[7:0] and the other is an image signal DN[7:0]. The number of output pins for data signals is 1080.

The source driver IC 600 includes 1080 pins 640, eight pins 641, eight pins 642, a low-voltage differential signaling (LVDS) receiver 610, a logic circuit 611, a circuit 620, a voltage generator circuit (VGEN) 631, and a buffer circuit (BUF) 632. The circuit 620 includes a shift register (SR) 612, a latch circuit (D-LAT) 613, a level shifter (LS) 614, a pass transistor logic circuit (PTL) 615, a multiplexer (MUX) 616, and an amplifier circuit (AMP) 617.

In the level shifter 614, the level shift circuit described in Embodiment 1 can be used, preventing an increase in area of the source driver IC 600 and an increase in power consumption of the source driver IC 600.

The pin 640 is an output pin for data signals and is electrically connected to the wiring S1 or the wiring S2. The pins 641 and 642 are input pins for differential signals. For example, a signal whose logic is inverted with respect to that of an input signal of the pin 641<1> is input to the pin 642<1>. For example, the image signals DP[0] to DP[7] are input to the respective pins 641<1> to 641<8>, and the image signals DN[0] to DN[7] are input to the respective pins 642<1> to 642<8>.

To the pins 641 and 642, not only the image signals DP[7:0] and DN[7:0] but also command signals are input. The source driver IC 600 is provided with input pins for a power supply voltage, input pins for various signals, and output pins for various signals in addition to the pins 640, 641, and 642.

The LVDS receiver 610 has a function of converting input differential signals into single-ended signals. Here, the LVDS receiver 610 converts the image signals DP[7:0] and DN[7:0] into a single-ended image signal DSE[7:0].

The logic circuit 611 controls the circuit 620 in accordance with a command signal input from the outside, for example. Specifically, the logic circuit 611 generates signals SSP, SRCLK, LTS[7:0], POL_OUT[7:0], and the like. The signals SSP and SRCLK are control signals for the SR 612. The signal LTS[7:0] is a control signal for the D-LAT 613. The signal POL_OUT[7:0] is a control signal for the MUX 616.

The logic circuit 611 has a function of converting serial image signals into parallel image signals (serial-to-parallel conversion function). Specifically, the logic circuit 611 converts the signal DSE[7:0] into eight 8-bit digital signals (DOUT[63:0]). Data of the signal DOUT[8α+7:8α] (α is an integer of 0 to 7) is 8-bit gray level data written to the wiring S1 or the wiring S2.

Figure 8:
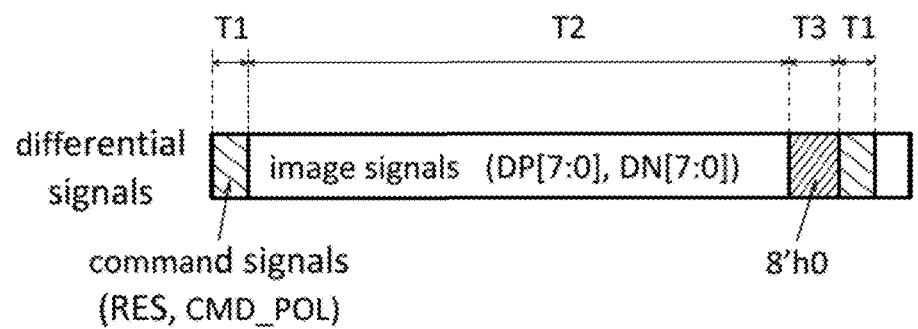
FIG. 8 illustrates an overview of the operation of a source driver IC.

The overview of the operation of the source driver IC 600 will be described with reference to FIG. 8. As shown in FIG. 8, the operation of the source driver IC 600 is broadly classified into three operations. A period T1 is a period for processing command signals. In the period T1, the logic circuit 611 processes differential signals input from the pins 641 and 642 as command signals. The length of the period T1 is determined by the number of command signals input to the logic circuit 611. At least a command signal (RES) for resetting the source driver IC 600 and a command signal (CMD_POL) for determining the polarity of the pin 640 are input to the logic circuit 611. Here, the data width of the command signal can be 1 to 8 bits.

In this specification, the polarity of the pin 640 refers to the polarity of the data signal DS output from the pin 640.

A period T2 is a period for processing image signals. In the period T2, the source driver IC 600 processes differential signals input from the pins 641 and 642 as image signals. That is, in the period T2, data signals DS<1> to DS<1080> are generated from the image signals DP[7:0] and DN[7:0]. In the period T2, the image signal DP[7:0] is input to the pins 641 and the image signal DN[7:0] is input to the pins 642, and these image signals are converted into the signal DSE[7:0] by the LVDS receiver 610. The logic circuit 611 processes the signal DSE[7:0] output from the LVDS receiver 610 as image signals, and controls the circuit 620 so that the circuit 620 generates the data signals DS<1> to DS<1080>.

A period T3 is a blank period. In the period T3, differential signals with 8'h0 are input to the pins 641 and 642, for example. In the period T3, the source driver IC 600 is on standby. After the period T3, the next period T1 starts by input of the signal RES. The signal RES also serves as a trigger for command signal processing in the logic circuit 611.

The circuit 620 processes the signal DOUT[63:0] and generates 1080 data signals DS. The data signal DS is an analog signal representing gray level data. The data signals DS<1> to DS<1080> are output from the respective pins 640<1> to 640<1080>.

Here, the SR 612 includes 135 flip-flop circuits (hereinafter referred to as "SR-FF"). The signal SSP (start pulse signal) is input to the first SR-FF, whereby a 1-bit signal SMP (sampling signal) is output from each SR-FF at predetermined timing. Thus, a 135-bit signal SMP[134:0] is output from the SR 612. The timing at which each SR-FF outputs the signal SMP is controlled with the clock signal SRCLK.

The D-LAT 613 samples the signal DOUT[63:0] in accordance with the signal SMP[134:0]. Accordingly, the D-LAT 613 stores 1080 8-bit data signals. The timing of outputting the 1080 data signals from the D-LAT 613 is controlled with the signal LTS[7:0]. The LS 614 shifts the levels of the 1080 data signals output from the D-LAT 613.

The PTL 615 is a circuit with a digital-to-analog (D/A) conversion function. Here, the PTL 615 generates 1080 pairs of analog signals on the basis of data of the output signals from the LS 614. Each pair of analog signals is composed of a positive analog signal and a negative analog signal.

The PTL 615 includes a PTL 615P and a PTL 615N. The PTL 615P has a function of converting an output signal from the LS 614 into a positive analog signal. The PTL 615N has a function of converting an output signal from the LS 614 into a negative analog signal. The VGEN 631 is a circuit for generating a reference voltage used by the PTL 615P and the PTL 615N to perform D/A conversion.

To the MUX 616, 1080 pairs of positive and negative analog signals are input. The MUX 616 selects one analog signal from each of the 1080 pairs in accordance with the signal POL[7:0] and outputs the selected signals to the AMP 617. The BUF 632 buffers the signal POL_OUT, shifts the level of the signal POL_OUT, and outputs the signal POL [7:0].

The AMP 617 amplifies 1080 analog signals output from the MUX 616. The 1080 output signals from the AMP 617 are the data signals DS<1> to DS<1080>.

FIG. 9 is a block diagram illustrating a structure example of the source driver IC 600 and specifically shows the components in the first and second columns as the circuit 620. A plurality of pins 645 illustrated in FIG. 9 are used to input control signals for controlling the logic circuit 611. Here, the pin 645 is an input terminal for single-ended digital signals. The pins 645 are provided as appropriate. For example, a control signal for setting the polarity of the pin 640 may be input from the pin 645, which will be described later.

(D-LAT 613)

As illustrated in FIG. 9, the D-LAT 613 includes a LAT 61 and a LAT 62 for each column. Each of the LATs 61 and 62 is a latch circuit capable of storing 8-bit data. Eight LATs 61 are controlled with one bit of the signal SMP[134:0]. The LAT 62 latches an output signal from the LAT 61 in a corresponding column. A signal DLT[7:0] output from the LAT 62 has the same logic as data held in the LAT 61. Any one bit of the signal LTS[7:0] is input to each of the LATs 62 as a latch signal. By input of an active latch signal, data of the signal DTL[7:0] is updated.

Note that in FIG. 9, Arabic numerals (1, 8) that are not used as reference numerals represent the bit width of signals. As an example, FIG. 9 illustrates that the LAT 61 is supplied with an 8-bit signal DOUT from the logic circuit 611 and a 1-bit signal SMP from the SR 612.

(LS 614)

The LS 614 includes a LS 64 for each column. In each column, the LS 64 shifts the level of the signal DLT[7:0] and generates signals DECP[7:0] and DECPB[7:0]. The signal DECP[7:0] has the same logic as the signal DLT[7:0]. The signal DECPB[7:0] is an inversion signal of the signal DECP[7:0]. Here, the signal DECP[6:0] of low-order 7 bits of the signal DECP[7:0] is output to the PTL 615P and the PTL 615N. Note that the components of the output signals from the LS 614 are set as appropriate in accordance with the configuration of a circuit that performs D/A conversion.

(PTL 615P and PTL 615N)

The PTL 615P includes a MUX 65P for each column, and the PTL 615N includes a MUX 65N for each column. The MUX 65P and the MUX 65N each have a function of converting an output signal from the LS 64 into an analog signal. Here, the MUX 65P converts the signal DECPB[7:0] into an analog signal to generate a signal DPTP, and the MUX 65N converts the signal DECPB[7:0] into an analog signal to generate a signal DPTN. The signals DPTP and DPTN are analog signals having a voltage corresponding to gray level data. The signal DPTP corresponds to a positive data signal DS, and the signal DPTN corresponds to a negative data signal DS.

(MUX 616 and AMP 617)

The MUX 616 includes a selector circuit (SEL) 26 for each column, and the AMP 617 includes an AMP 27 for each column. The SEL 26 outputs one of the signals DPTP and DPTN to the AMP 27 in accordance with a control signal. Any one bit of the signal POL[7:0] is input to the SEL 26 as a control signal. The SEL 26 outputs the signal DPTP when data of a 1-bit signal POL input thereto is "1," and outputs the signal DPTN when the data is "0."

An output signal from the SEL 26 is amplified by the AMP 27, and the amplified signal is output from the AMP 27. When the signal DPTP is amplified by the AMP 27, a positive data signal DS is obtained. When the signal DPTN is amplified by the AMP 27, a negative data signal DS is obtained. That is, the polarity of the signal DS can be determined by data ("0"/"1") of the signal POL for controlling the SEL 26 in a corresponding column.

(VGEN631)

The VGEN 631 includes a VGEN 631P and a VGEN 631N. The VGEN 631P generates voltages VP<0> to VP<255>, and the VGEN 631N generates voltages VN<0> to VN<255>. The voltages VP<0> to VP<255> are reference voltages for D/A conversion in the PTL 615P and correspond to respective gray levels 0 to 255. The voltages VN<0> to VN<255> are reference voltages for D/A conversion in the PTL 615N and correspond to respective gray levels 0 to 255.

The voltage VP<255> is higher than the voltage VP<0>, and the voltage VN<255> is lower than the voltage VN<0>. For example, when the voltage VP<0> and the voltage VN<0> are set at the same voltage as VCOM (a common voltage of the liquid crystal element), the MUX 65P can generate an analog signal with a voltage higher than or equal to VCOM and the MUX 65N can generate an analog signal with a voltage lower than or equal to VCOM.

The above is the description of the structure of the source driver IC 600.

The use of the source driver IC 600 including the level shift circuit in Embodiment 1 can prevent an increase in power consumption of the display device 400 and an increase in size of the display device 400.

The pixel 410 includes a reflective liquid crystal element and a light-emitting element. In the pixel 410, the liquid crystal element and the light-emitting element partly overlap with each other.

FIG. 10B1 illustrates a structure example of conductive layers 311b included in the pixels 410. The conductive layer 311b serves as a reflective electrode of the liquid crystal element in the pixel 410. The conductive layer 311b has an opening 451.

In FIG. 10B1, a light-emitting element 360 in a region overlapping with the conductive layer 311b is denoted by a dashed line. The light-emitting element 360 overlaps with the opening 451 of the conductive layer 311b. Thus, light from the light-emitting element 360 is emitted to a display surface side through the opening 451.

In FIG. 10B1, the pixels 410 adjacent in the direction R correspond to different colors. As illustrated in FIG. 10B1, the openings 451 are preferably provided in different positions in the conductive layers 311b so as not to be aligned in the two pixels adjacent to each other in the direction R. This allows the two light-emitting elements 360 to be apart from each other, thereby preventing light emitted from the light-emitting element 360 from entering a coloring layer in the adjacent pixel 410 (such a phenomenon is also referred to as crosstalk). Furthermore, since the two adjacent light-emitting elements 360 can be arranged apart from each other, a high-resolution display device is achieved even when electroluminescent (EL) layers of the light-emitting elements 360 are separately formed with a shadow mask or the like.

Alternatively, arrangement illustrated in FIG. 10B2 may be employed.

If the ratio of the total area of the opening 451 to the total area except for the opening is too large, display performed using the liquid crystal element is dark. If the ratio of the total area of the opening 451 to the total area except for the opening is too small, display performed using the light-emitting element 360 is dark.

If the area of the opening 451 in the conductive layer 311b serving as a reflective electrode is too small, light emitted from the light-emitting element 360 is not efficiently extracted.

The opening 451 can have, for example, a polygonal, quadrangular, elliptical, circular, or cross shape. Alternatively, the opening 451 may have a stripe shape, a slit shape, or a checkered pattern. The opening 451 may be provided close to the adjacent pixel. Preferably, the opening 451 is provided close to another pixel emitting light of the same color, in which case crosstalk can be suppressed.

[Circuit Configuration Example]

Figure 11:
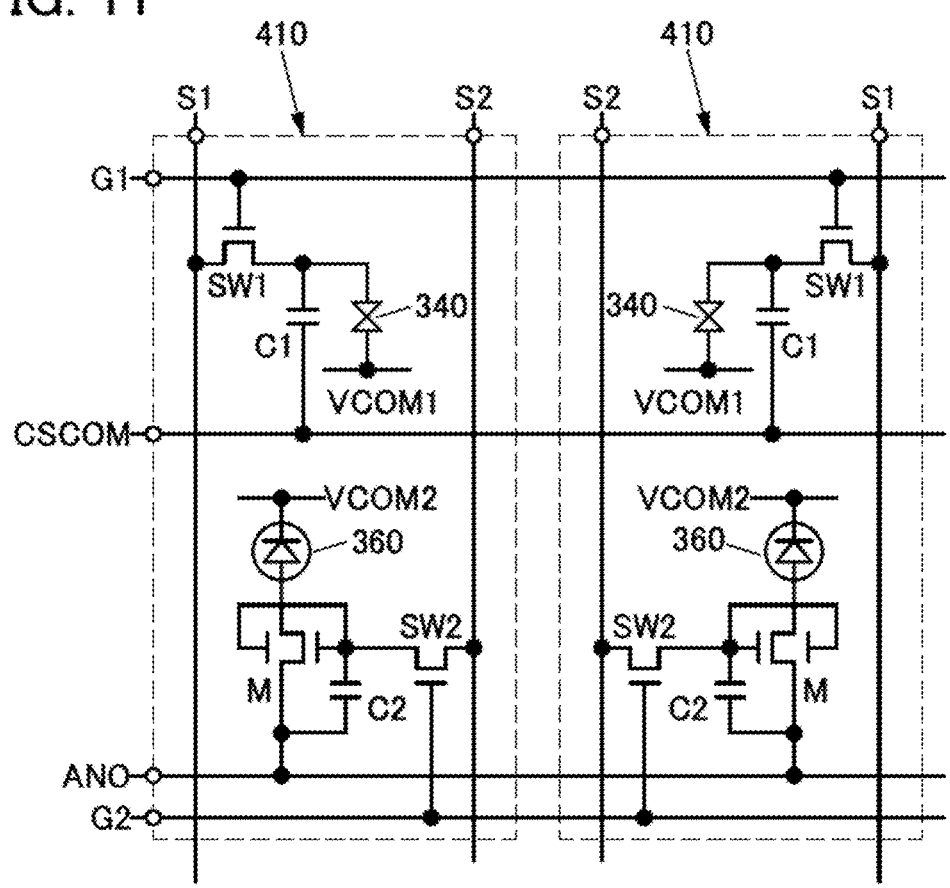
FIG. 11 illustrates a circuit of a display device.

FIG. 11 is a circuit diagram illustrating a configuration example of the pixel 410. FIG. 11 shows two adjacent pixels 410.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 11 also illustrates a wiring VCOM1 electrically connected to the liquid crystal element 340 and a wiring VCOM2 electrically connected to the light-emitting element 360.

FIG. 11 illustrates an example in which a transistor is used as each of the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 11 illustrates an example where the transistor M has two gates between which a semiconductor is provided and which are connected to each other. This structure can increase the amount of current flowing through the transistor M.

The wiring G1 can be supplied with a signal for changing the on/off state of the transistor SW1. The wiring VCOM1 can be supplied with a predetermined potential. The wiring S1 can be supplied with a signal for changing the alignment state of liquid crystals of the liquid crystal element 340. The wiring CSCOM can be supplied with a predetermined potential.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 11, for example, an image can be displayed in the reflective mode by driving the pixel with the signals supplied to the wiring G1 and the wiring S1 and utilizing the optical modulation of the liquid crystal element 340. When an image is displayed in the transmissive mode, the pixel is driven with the signals supplied to the wiring G2 and the wiring S2 and the light-emitting element 360 emits light. When both modes are performed at the same time, the pixel can be driven with the signals supplied to the wiring G1, the wiring G2, the wiring S1, and the wiring S2.

Figure 12A:
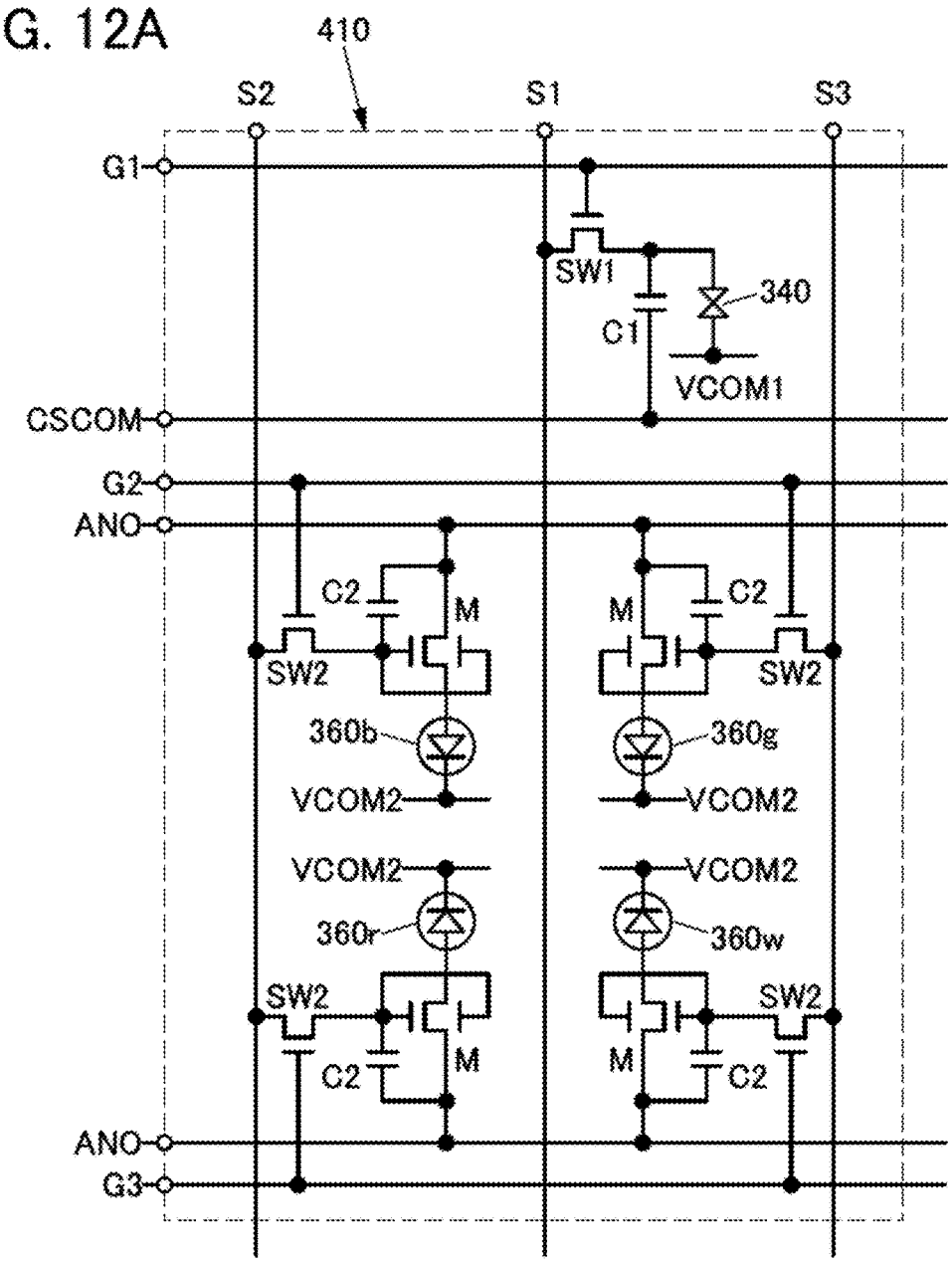
FIG. 12A illustrates a circuit of a display device.

Although FIG. 11 illustrates an example in which one pixel 410 includes one liquid crystal element 340 and one light-emitting element 360, one embodiment of the present invention is not limited to this example. FIG. 12A illustrates an example in which one pixel 410 includes one liquid crystal element 340 and four light-emitting elements 360 (light-emitting elements 360r, 360g, 360b, and 360w).

In FIG. 12A, a wiring G3 and a wiring S3 in addition to the wirings in FIG. 11 are connected to the pixel 410.

In the example of FIG. 12A, the four light-emitting elements 360 can be light-emitting elements emitting red light (R), green light (G), blue light (B), and white light (W), for example, and the liquid crystal element 340 can be a reflective liquid crystal element exhibiting white light. This enables white display with high reflectance in the reflective mode, and enables display with excellent color-rendering properties and low power consumption in the transmissive mode.

Figure 12B:
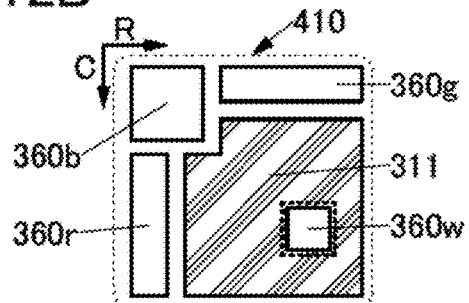
FIG. 12B is a top view of a pixel.

FIG. 12B illustrates a configuration example of the pixel 410. The pixel 410 includes the light-emitting element 360w that overlaps with an opening of an electrode 311, and the light-emitting elements 360r, 360g, and 360b that are provided around the electrode 311. The light-emitting elements 360r, 360g, and 360b preferably have almost the same light-emitting area.

[Structure Example of Display Panel]

Figure 13:
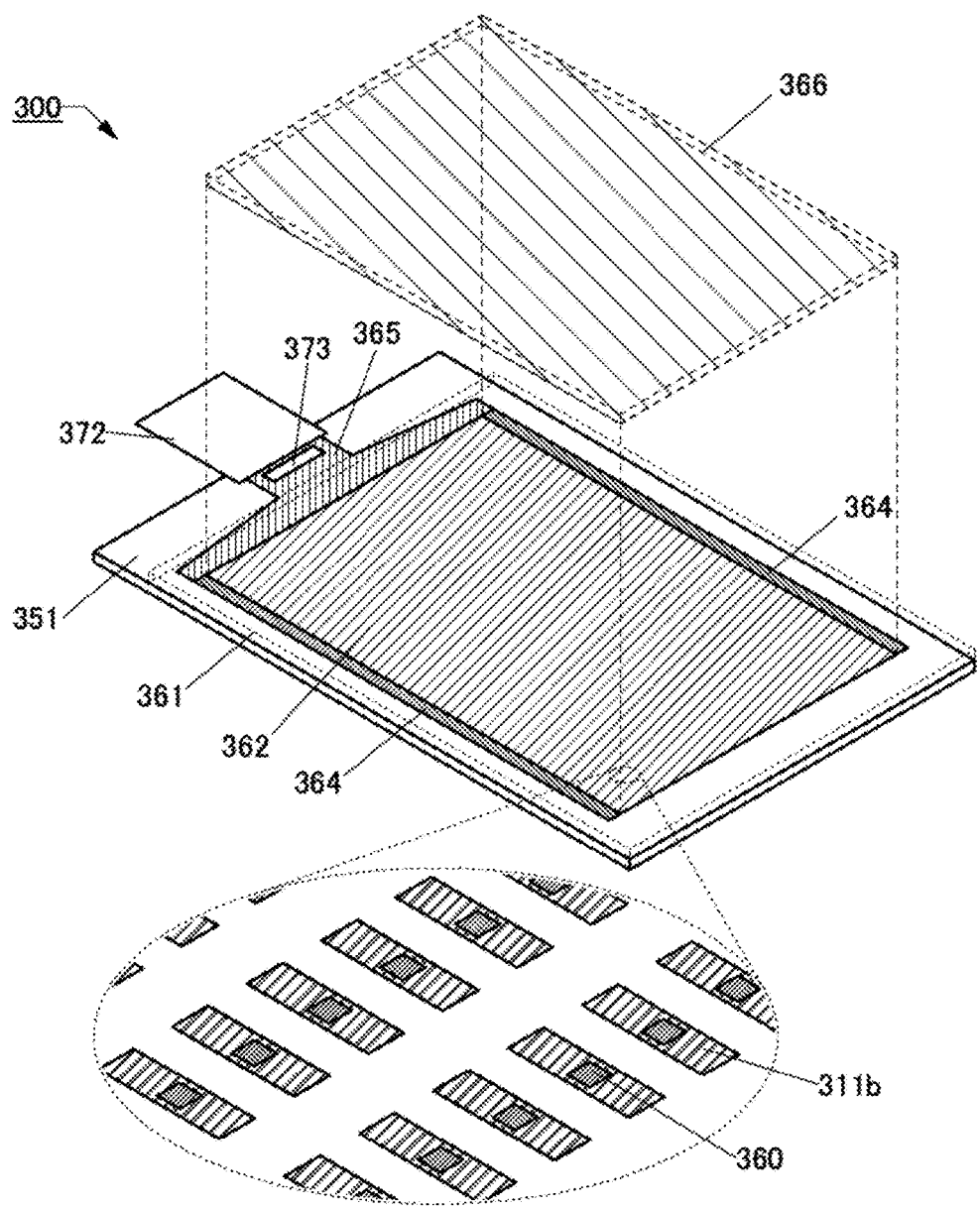
FIG. 13 illustrates a structure of a display device.

FIG. 13 is a schematic perspective view illustrating a display panel 300 of one embodiment of the present invention. In the display panel 300, a substrate 351 and a substrate 361 are attached to each other. In FIG. 13, the substrate 361 is denoted by a dashed line.

The display panel 300 includes the display portion 362, a circuit 364, a wiring 365, and the like. The substrate 351 is provided with the circuit 364, the wiring 365, the conductive layer 311b serving as a pixel electrode, and the like. In the example of FIG. 13, an IC 373 and an FPC 372 are mounted on the substrate 351. Thus, the structure illustrated in FIG. 13 can be regarded as a display module including the display panel 300, the FPC 372, and the IC 373.

As the circuit 364, a circuit functioning as a scan line driver circuit can be used, for example.

The wiring 365 has a function of supplying a signal and electric power to the display portion 362 and the circuit 364. The signal and electric power are input to the wiring 365 from the outside through the FPC 372 or from the IC 373.

FIG. 13 shows an example in which the IC 373 is provided on the substrate 351 by a chip on glass (COG) method or the like. The IC 373 can be an IC functioning as a scan line driver circuit or a signal line driver circuit, for example. Note that the IC 373 may be omitted, for example, when the display panel 300 includes circuits serving as a scan line driver circuit and a signal line driver circuit or when circuits serving as a scan line driver circuit and a signal line driver circuit are provided outside and a signal for driving the display panel 300 is input through the FPC 372. Alternatively, the IC 373 may be mounted on the FPC 372 by a chip on film (COF) method or the like.

FIG. 13 also shows an enlarged view of part of the display portion 362. The conductive layers 311b included in a plurality of display elements are arranged in a matrix in the display portion 362. The conductive layer 311b has a function of reflecting visible light and serves as a reflective electrode of the liquid crystal element 340 described later.

As illustrated in FIG. 13, the conductive layer 311b has an opening. The light-emitting element 360 is positioned closer to the substrate 351 than the conductive layer 311b is. Light is emitted from the light-emitting element 360 to the substrate 361 side through the opening in the conductive layer 311b.

A touch sensor can be provided over the substrate 361. For example, a sheet-like capacitive touch sensor 366 is provided to overlap with the display portion 362. Alternatively, a touch sensor may be provided between the substrate 361 and the substrate 351, in which case it is possible to employ an optical touch sensor using a photoelectric conversion element as well as a capacitive touch sensor.

Cross-Sectional Structure Example 1

Figure 14:
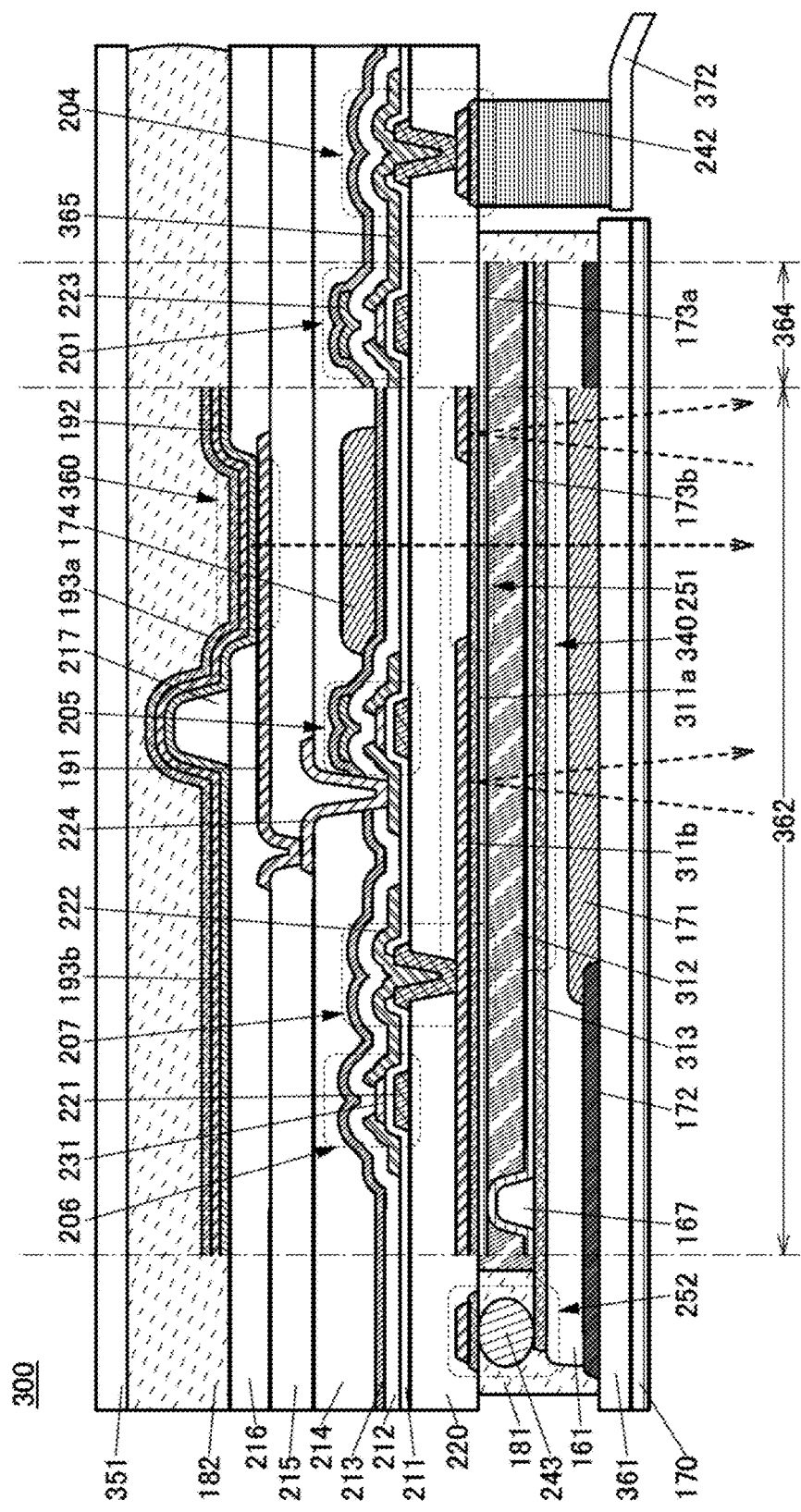
FIG. 14 illustrates a structure of a display device.

FIG. 14 shows an example of cross sections of a part of a region including the FPC 372, a part of a region including the circuit 364, and a part of a region including the display portion 362 of the display panel exemplified in FIG. 13. Note that the touch sensor 366 is not shown in FIG. 14.

The display panel includes an insulating layer 220 between the substrates 351 and 361. The light-emitting element 360, a transistor 201, a transistor 205, a transistor 206, a coloring layer 174, and the like are provided between the substrate 351 and the insulating layer 220. The liquid crystal element 340, a coloring layer 171, and the like are provided between the insulating layer 220 and the substrate 361. The substrate 361 and the insulating layer 220 are attached to each other with an adhesive layer 181. The substrate 351 and the insulating layer 220 are attached to each other with an adhesive layer 182.

The transistor 206 is electrically connected to the liquid crystal element 340. The transistor 205 is electrically connected to the light-emitting element 360. The transistors 205 and 206 are formed on a surface of the insulating layer 220 that is on the substrate 351 side, and thus can be formed through the same process.

The coloring layer 171, a light-blocking layer 172, an insulating layer 161, a conductive layer 313 serving as a common electrode of the liquid crystal element 340, an alignment film 173b, an insulating layer 167, and the like are provided over the substrate 361. The insulating layer 167 functions as a spacer for keeping the cell gap of the liquid crystal element 340.

Insulating layers such as an insulating layer 211, an insulating layer 212, an insulating layer 213, an insulating layer 214, and an insulating layer 215 are provided on the substrate 351 side of the insulating layer 220. Part of the insulating layer 211 functions as a gate insulating layer of each transistor. The insulating layers 212, 213, and 214 are provided to cover each transistor. The insulating layer 215 is provided to cover the insulating layer 214. The insulating layers 214 and 215 each function as a planarization layer. Note that an example where the three insulating layers 212, 213, and 214 are provided to cover the transistors and the like is described here; however, one embodiment of the present invention is not limited to this example, and four or more insulating layers, a single insulating layer, or two insulating layers may be provided. The insulating layer 214 serving as a planarization layer is not necessarily provided.

The transistors 201, 205, and 206 each include a conductive layer 221 part of which functions as a gate, conductive layers 222 part of which functions as a source and a drain, and a semiconductor layer 231. Here, a plurality of layers obtained by processing one conductive film are shown with the same hatching pattern.

The liquid crystal element 340 is a reflective liquid crystal element. The liquid crystal element 340 has a structure in which a conductive layer 311a, a liquid crystal 312, and the conductive layer 313 are stacked. The conductive layer 311b that reflects visible light is provided in contact with the substrate 351 side of the conductive layer 311a. The conductive layer 311b has an opening 251. The conductive layers 311a and 313 contain a material transmitting visible light. An alignment film 173a is provided between the liquid crystal 312 and the conductive layer 311a. The alignment film 173b is provided between the liquid crystal 312 and the conductive layer 313. A polarizing plate 170 is provided on an outer surface of the substrate 361.

In the liquid crystal element 340, the conductive layer 311b has a function of reflecting visible light, and the conductive layer 313 has a function of transmitting visible light. Light entering from the substrate 361 side is polarized by the polarizing plate 170, passes through the conductive layer 313 and the liquid crystal 312, and is reflected by the conductive layer 311b. Then, the light passes through the liquid crystal 312 and the conductive layer 313 again and reaches the polarizing plate 170. In this case, the alignment of the liquid crystal is controlled by a voltage applied between the conductive layer 311b and the conductive layer 313, and thus, optical modulation of light can be controlled. In other words, the intensity of light emitted through the polarizing plate 170 can be controlled. Light other than one in a particular wavelength region of the light is absorbed by the coloring layer 171, and thus, emitted light is red light, for example.

The light-emitting element 360 is a bottom-emission light-emitting element. The light-emitting element 360 has a structure in which a conductive layer 191, an EL layer 192, and a conductive layer 193b are stacked in this order from the insulating layer 220 side. A conductive layer 193a is provided to cover the conductive layer 193b. The conductive layer 193b contains a material reflecting visible light, and the conductive layers 191 and 193a contain a material transmitting visible light. Light is emitted from the light-emitting element 360 to the substrate 361 side through the coloring layer 174, the insulating layer 220, the opening 251, the conductive layer 313, and the like.

Here, as illustrated in FIG. 14, the opening 251 is preferably provided with the conductive layer 311a, which transmits visible light. Accordingly, the liquid crystal 312 in a region overlapping with the opening 251 is aligned in a similar manner as in the other regions, preventing undesired light leakage caused by an alignment defect of the liquid crystal in the boundary portion of the region overlapping with the opening 251 and the other regions.

As the polarizing plate 170 provided on the outer surface of the substrate 361, a linear polarizing plate or a circularly polarizing plate can be used. An example of a circularly polarizing plate is a stack including a linear polarizing plate and a quarter-wave retardation plate. Such a structure can reduce reflection of external light. A light diffusion plate may be provided to reduce reflection of external light. The cell gap, alignment, driving voltage, and the like of the liquid crystal element used as the liquid crystal element 340 are controlled depending on the kind of the polarizing plate so that desirable contrast is obtained.

An insulating layer 217 is provided over the insulating layer 216 that covers an end portion of the conductive layer 191. The insulating layer 217 functions as a spacer for preventing the insulating layer 220 and the substrate 351 from getting closer than necessary. When the EL layer 192 and the conductive layer 193a are formed using a shadow mask (metal mask), the insulating layer 217 may have a function of preventing the shadow mask from being in contact with a surface on which the EL layer 192 or the conductive layer 193a is formed. Note that the insulating layer 217 is not necessarily provided.

One of a source and a drain of the transistor 205 is electrically connected to the conductive layer 191 of the light-emitting element 360 through a conductive layer 224.

One of a source and a drain of the transistor 206 is electrically connected to the conductive layer 311b through a connection portion 207. The conductive layers 311a and 311b are in contact with and electrically connected to each other. Here, in the connection portion 207, the conductive layers provided on both surfaces of the insulating layer 220 are connected to each other through an opening in the insulating layer 220.

A connection portion 204 is provided in a region where the substrate 351 and the substrate 361 do not overlap with each other. The connection portion 204 is electrically connected to the FPC 372 through a connection layer 242. The connection portion 204 has a structure similar to that of the connection portion 207. On the top surface of the connection portion 204, a conductive layer obtained by processing the same conductive film as the conductive layer 311a is exposed. Thus, the connection portion 204 and the FPC 372 can be electrically connected to each other through the connection layer 242.

A connection portion 252 is provided in part of a region where the adhesive layer 181 is provided. In the connection portion 252, the conductive layer obtained by processing the same conductive film as the conductive layer 311a is electrically connected to part of the conductive layer 313 with a connector 243. Accordingly, a signal or a potential input from the FPC 372 connected to the substrate 351 side can be supplied to the conductive layer 313 formed on the substrate 361 side through the connection portion 252.

As the connector 243, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 243, a material capable of elastic deformation or plastic deformation is preferably used. In that case, the connector 243, which is the conductive particle, sometimes has a shape that is squeezed vertically as illustrated in FIG. 14. With the connector 243 having the squeezed shape, the contact area between the connector 243 and a conductive layer electrically connected to the connector 243 can be increased, thereby reducing contact resistance and suppressing defects such as disconnection.

The connector 243 is preferably provided to be covered with the adhesive layer 181. For example, the connector 243 is dispersed in the adhesive layer 181 before the adhesive layer 181 is cured.

FIG. 14 illustrates an example of the circuit 364 including the transistor 201.

In FIG. 14, the transistors 201 and 205 employ a structure in which the semiconductor layer 231 where a channel is formed is provided between two gates. One of the gates is formed of the conductive layer 221, and the other gate is formed of a conductive layer 223 that overlaps with the semiconductor layer 231 with the insulating layer 212 placed therebetween. Such a structure enables control of the threshold voltage of the transistor. In that case, the two gate electrodes may be connected to each other and supplied with the same signal to operate the transistor. Such a transistor can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display panel in which the number of wirings is increased because of increase in size or resolution.

Note that the transistor included in the circuit 364 and the transistor included in the display portion 362 may have the same structure. A plurality of transistors included in the circuit 364 may have the same structure or different structures. A plurality of transistors included in the display portion 362 may have the same structure or different structures.

A material through which impurities such as water or hydrogen do not easily diffuse is preferably used for at least one of the insulating layers 212 and 213 that cover the transistors. That is, the insulating layer 212 or the insulating layer 213 can function as a barrier film. Such a structure can effectively suppress diffusion of impurities into the transistors from the outside, and a highly reliable display panel can be provided.

The insulating layer 161 is provided on the substrate 361 side to cover the coloring layer 171 and the light-blocking layer 172. The insulating layer 161 may function as a planarization layer. The insulating layer 161 enables the conductive layer 313 to have an almost flat surface, resulting in a uniform alignment state of the liquid crystal 312.

Cross-Sectional Structure Example 2

Figure 15:
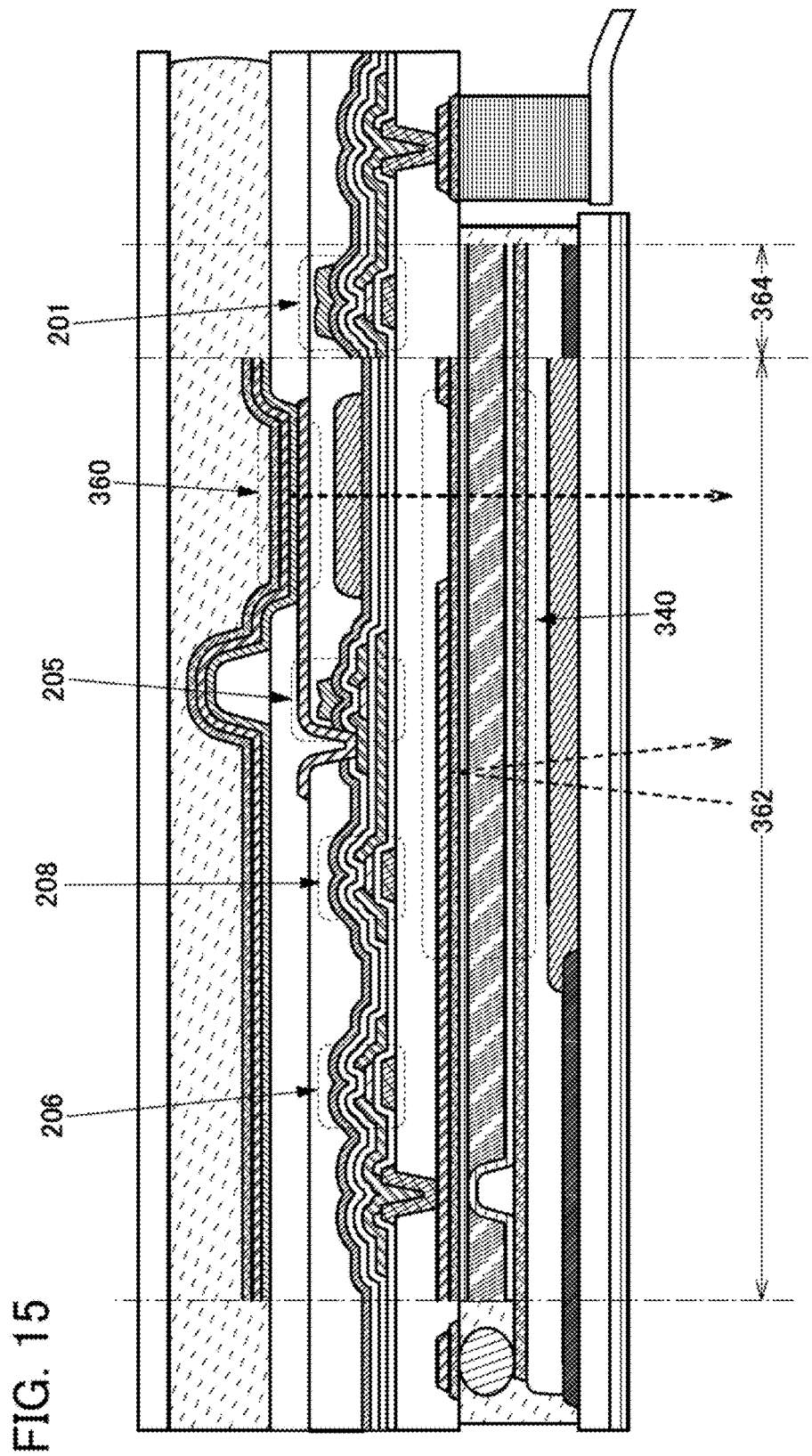
FIG. 15 illustrates a structure of a display device.

The display panel of one embodiment of the present invention may include a region where a first transistor and a second transistor that are provided in a pixel overlap with each other as illustrated in FIG. 15. Such a structure allows a display panel to have a smaller area per pixel and a higher pixel density enabling display of higher-resolution images.

For example, the display panel can include a region where the transistor 205 for driving the light-emitting element 360 and the transistor 208 overlap with each other. Alternatively, the display panel may include a region where the transistor 206 for driving the liquid crystal element 340 and one of the transistors 205 and 208 overlap with each other.

Cross-Sectional Structure Example 3

Figure 16:
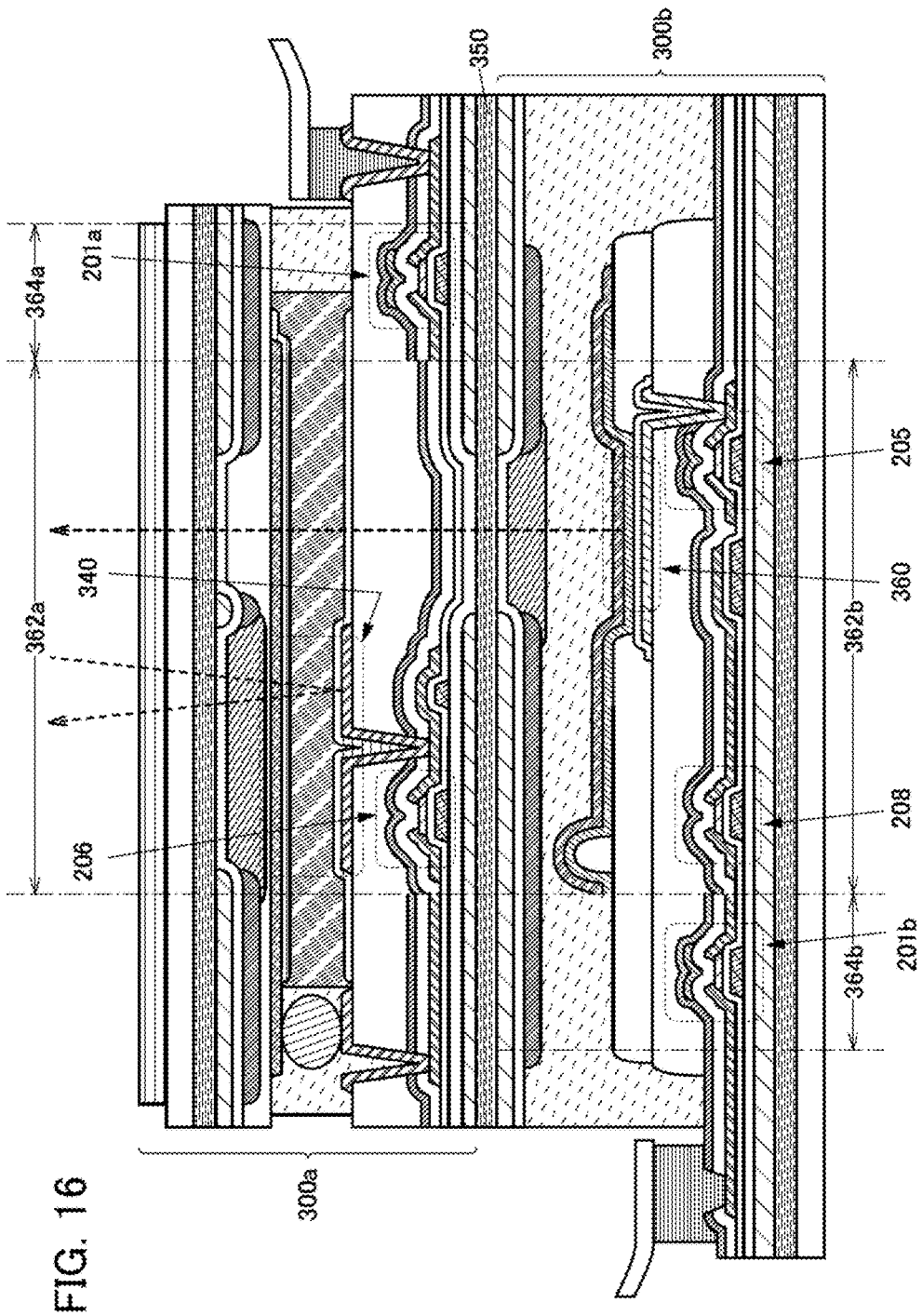
FIG. 16 illustrates a structure of a display device.

In the display panel of one embodiment of the present invention, a display panel 300a and a display panel 300b may be attached to each other through an adhesive layer 350 as illustrated in FIG. 16. The display panel 300a includes the liquid crystal element 340 and the transistor 206 in a display portion 362a, and a transistor 201a in a circuit 364a for driving the display portion 362a. The display panel 300b includes the light-emitting element 360 and the transistors 205 and 208 in a display portion 362b, and a transistor 201b in a circuit 364b for driving the display portion 362b.

With such a structure, it is possible to employ different manufacturing steps appropriate for each of the display panels 300a and 300b, resulting in higher manufacturing yield.

[Components]

The above components will be described below.

[Substrate]

A material having a flat surface can be used for the substrate included in the display panel. The substrate through which light emitted from the display element is extracted is formed using a material that transmits the light. For example, glass, quartz, ceramic, sapphire, or an organic resin can be used.

The weight and thickness of the display panel can be decreased by using a thin substrate. A flexible display panel can be obtained by using a substrate that is thin enough to have flexibility.

Since the substrate through which emitted light is not extracted does not need to have a light-transmitting property, a metal substrate or the like can be used in addition to the above-mentioned substrates. A metal substrate, which has high thermal conductivity, is preferable because it can easily conduct heat to the whole substrate and accordingly can prevent a local temperature rise in the display panel. To obtain flexibility or bendability, the thickness of a metal substrate is preferably from 10 µm to 200 µm, further preferably from 20 µm to 50 µm.

Although there is no particular limitation on a material of a metal substrate, it is preferable to use a metal such as aluminum, copper, or nickel or an alloy such as an aluminum alloy or stainless steel, for example.

It is possible to use a substrate subjected to insulation treatment, e.g., a metal substrate whose surface is oxidized or provided with an insulating film. The insulating film may be formed, for example, by a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of the material that has flexibility and transmits visible light include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. In particular, a material whose thermal expansion coefficient is low is preferred, and for example, a polyamide imide resin, a polyimide resin, or PET with a thermal expansion coefficient of $30 \times 10^{-6}$/K or less can be suitably used. It is also possible to use a substrate in which a glass fiber is impregnated with an organic resin or a substrate whose thermal expansion coefficient is reduced by mixing an organic resin with an inorganic filler. A substrate using such a material is lightweight, and thus a display panel using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples include a polyvinyl alcohol-based fiber, a polyester-based fiber, a polyamide-based fiber, a polyethylene-based fiber, an aramid-based fiber, a polyparaphenylene benzobisoxazole fiber, a glass fiber, and a carbon fiber. As the glass fiber, a glass fiber using E glass, S glass, D glass, Q glass, or the like can be given. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against breaking due to bending or local pressure can be increased.

Alternatively, glass, a metal, or the like that is thin enough to have flexibility can be used as the substrate. Alternatively, a composite material where glass and a resin material are attached to each other with an adhesive layer may be used.

A hard coat layer (e.g., a silicon nitride layer or an aluminum oxide layer) by which a surface of the display panel is protected from damage, a layer (e.g., an aramid resin layer) that can disperse pressure, or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate can be formed by stacking a plurality of layers. When a glass layer is used, barrier properties against water and oxygen are improved, and thus a highly reliable display panel can be provided.

[Transistor]

The transistor includes a conductive layer serving as a gate electrode, a semiconductor layer, a conductive layer serving as a source electrode, a conductive layer serving as a drain electrode, and an insulating layer serving as a gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As a semiconductor material used for the transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAC-OS described later can be used, for example.

Because of a low off-state current of a transistor that contains an oxide semiconductor having a larger band gap and a lower carrier density than silicon, charge stored in a capacitor connected in series with the transistor can be held for a long time.

The semiconductor layer can be, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer is an In-M-Zn-based oxide, the atomic ratio of metal elements of a sputtering target used for forming a film of the In-M-Zn oxide preferably satisfy In≥M and Zn≥M. The atomic ratio of the metal elements (In:M:Zn) in such a sputtering target is preferably 1:1:1, 1:1:1.2, 3:1:2, 4:2:3, 4:2:4.1, 5:1:6, 5:1:7, or 5:1:8, for example. Note that the atomic ratio of the metal elements in the formed oxide semiconductor layer varies from the above atomic ratios of the metal elements of the sputtering targets in a range of ±40%.

The bottom-gate transistor described in this embodiment is preferable because the number of manufacturing steps can be reduced. When an oxide semiconductor, which can be formed at a lower temperature than polycrystalline silicon, is used for the semiconductor layer in the bottom-gate transistor, materials with low heat resistance can be used for a wiring, an electrode, and a substrate below the semiconductor layer; thus, the range of choices of materials can be widened. For example, an extremely large glass substrate can be favorably used.

An oxide semiconductor film with a low carrier density is used as the semiconductor layer. For example, the semiconductor layer can be formed using an oxide semiconductor whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$, even more preferably lower than $1\times10^{10}/cm^3$ and is higher than or equal to $1\times10^{-9}/cm^3$. Such an oxide semiconductor is referred to as a highly purified intrinsic or substantially highly purified intrinsic oxide semiconductor. Such an oxide semiconductor has a low impurity concentration and a low density of defect states and can thus be regarded as having stable characteristics.

Note that without limitation to the above examples, a material with an appropriate composition can be used depending on required semiconductor characteristics and electrical characteristics (e.g., field-effect mobility and threshold voltage) of the transistor. To obtain required semiconductor characteristics of the transistor, the carrier density, impurity concentration, defect density, atomic ratio between a metal element and oxygen, interatomic distance, density, and the like of the semiconductor layer are preferably set to appropriate values.

When silicon or carbon, which are elements belonging to Group 14, is contained in the oxide semiconductor included in the semiconductor layer, oxygen vacancies are increased in the semiconductor layer and the semiconductor layer becomes n-type. Thus, the concentration of silicon or carbon (measured by secondary ion mass spectrometry) in the semiconductor layer is lower than or equal to $2\times10^{18}$ atoms/$cm^3$, preferably lower than or equal to $2\times10^{17}$ atoms/$cm^3$.

Alkali metal and alkaline earth metal may generate carriers when bonded to an oxide semiconductor, in which case the off-state current of the transistor might be increased. Therefore, the concentration of alkali metal or alkaline earth metal of the semiconductor layer, which is measured by secondary ion mass spectrometry, is lower than or equal to $1\times10^{18}$ atoms/$cm^3$, preferably lower than or equal to $2\times10^{16}$ atoms/$cm^3$.

When nitrogen is contained in the oxide semiconductor included in the semiconductor layer, electrons serving as carriers are generated and the carrier density increases, so that the semiconductor layer easily becomes n-type. Thus, a transistor including an oxide semiconductor that contains nitrogen is likely to be normally-on. Hence, the concentration of nitrogen of the semiconductor layer measured by secondary ion mass spectrometry is preferably lower than or equal to $5\times10^{18}$ atoms/$cm^3$.

The semiconductor layer may have a non-single-crystal structure, for instance. Examples of the non-single-crystal structure include a CAAC-OS (c-axis-aligned crystalline oxide semiconductor, or c-axis-aligned a-b-plane-anchored crystalline oxide semiconductor) including a c-axis-aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film with the amorphous structure has, for example, disordered atomic arrangement and no crystalline component. Alternatively, an oxide film with the amorphous structure has, for example, an absolutely amorphous structure and no crystal part.

Note that the semiconductor layer may be a mixed film including two or more of the following: a region with an amorphous structure, a region with a microcrystalline structure, a region with a polycrystalline structure, a CAAC-OS region, and a region with a single crystal structure. The mixed film has, for example, a single-layer structure or a stacked-layer structure including two or more of the above regions in some cases.

<Composition of CAC-OS>

Described below is the composition of a cloud-aligned composite oxide semiconductor (CAC-OS) applicable to a transistor disclosed in one embodiment of the present invention.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, an oxide semiconductor preferably contains indium and zinc. In addition, an oxide semiconductor may contain one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to the element M in a second region, the first region has higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS containing In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different compositions is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

When one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated, for example. In the case where the CAC-OS is formed by a sputtering method, one or more of an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS that is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility (µ) can be achieved.

A semiconductor element including a CAC-OS has high reliability. Thus, the CAC-OS is suitably used in a variety of semiconductor devices typified by a display.

Alternatively, silicon may be used as a semiconductor in which a channel of a transistor is formed. Silicon may be amorphous silicon but is preferably silicon having crystallinity, such as microcrystalline silicon, polycrystalline silicon, or single crystal silicon. In particular, polycrystalline silicon can be formed at a lower temperature than single crystal silicon and has higher field-effect mobility and higher reliability than amorphous silicon.

The bottom-gate transistor described in this embodiment is preferable because the number of manufacturing steps can be reduced. When amorphous silicon, which can be formed at a lower temperature than polycrystalline silicon, is used for the semiconductor layer in the bottom-gate transistor, materials with low heat resistance can be used for a wiring, an electrode, and a substrate below the semiconductor layer, resulting in wider choice of materials. For example, an extremely large glass substrate can be favorably used. Meanwhile, a top-gate transistor is preferable because an impurity region is easily formed in a self-aligned manner and variations in characteristics can be reduced. A top-gate transistor is suitable particularly when polycrystalline silicon, single crystal silicon, or the like is used.

[Conductive Layer]

As materials for a gate, a source, and a drain of a transistor, and conductive layers such as a wiring and an electrode included in a display device, any of metals such as aluminum, titanium, chromium, nickel, copper, yttrium, zirconium, molybdenum, silver, tantalum, and tungsten, or an alloy containing any of these metals as its main component can be used. A single-layer structure or stacked-layer structure including a film containing any of these materials can be employed. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of shape processing by etching is increased.

As a light-transmitting conductive material, a conductive oxide such as indium oxide, indium tin oxide, indium zinc oxide, zinc oxide, or zinc oxide to which gallium is added, or graphene can be used. It is also possible to use a metal material such as gold, silver, platinum, magnesium, nickel, tungsten, chromium, molybdenum, iron, cobalt, copper, palladium, or titanium; an alloy material containing any of these metal materials; or a nitride of any of these metal materials (e.g., titanium nitride). In the case of using the metal material or the alloy material (or the nitride thereof), the film thickness is set small enough to transmit light. Alternatively, a stacked film of any of the above materials can be used as the conductive layer. For example, a stacked film of indium tin oxide and an alloy of silver and magnesium is preferably used because the conductivity can be increased. The above materials can also be used for conductive layers such as a variety of wirings and electrodes included in a display device, and conductive layers included in a display element (e.g., conductive layers serving as a pixel electrode or a common electrode).

[Insulating Layer]

Examples of an insulating material that can be used for the insulating layers include a resin such as acrylic and epoxy resin; a resin having a siloxane bond, such as silicone; and an inorganic insulating material such as silicon oxide, silicon oxynitride, silicon nitride oxide, silicon nitride, and aluminum oxide.

The light-emitting element is preferably provided between a pair of insulating films with low water permeability, in which case impurities such as water can be prevented from entering the light-emitting element. Thus, a decrease in device reliability can be prevented.

Examples of the insulating film with low water permeability include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes. Other than the VA mode, the liquid crystal element can employ, for example, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, or an antiferroelectric liquid crystal (AFLC) mode.

The liquid crystal element controls transmission or non-transmission of light utilizing an optical modulation action of liquid crystal. Note that optical modulation action of liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, either positive liquid crystal or negative liquid crystal can be used; an appropriate liquid crystal material needs to be selected depending on the mode or design to be used.

An alignment film can be provided to adjust the alignment of liquid crystal. In the case where a horizontal electric field mode is employed, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed to account for several weight percent or more is used for the liquid crystal layer in order to widen the temperature range. A liquid crystal composition that includes liquid crystal exhibiting a blue phase and a chiral material has a short response time and optical isotropy, which makes the alignment process unneeded. Moreover, such a liquid crystal composition has a small viewing angle dependence. An alignment film does not need to be provided and rubbing treatment is thus not necessary; accordingly, electrostatic discharge damage caused by the rubbing treatment can be prevented, and defects and damage of a display device in the manufacturing process can be reduced.

The liquid crystal element can be a transmissive liquid crystal element, a reflective liquid crystal element, a transflective liquid crystal element, or the like.

More specifically, a reflective liquid crystal element can be used in one embodiment of the present invention.

In the case of using a transmissive or transflective liquid crystal element, two polarizing plates are provided such that a pair of substrates is sandwiched therebetween. Furthermore, a backlight is provided on the outer side of the polarizing plate. The backlight can be a direct-type backlight or an edge-lit backlight. A direct-type backlight including a light-emitting diode (LED) is preferable because local dimming is easily performed and thus the contrast can be increased. Meanwhile, an edge-lit backlight is preferable because the thickness of a module including the backlight can be reduced.

In the case of using a reflective liquid crystal element, a polarizing plate is provided on a display surface. In addition, a light diffusion plate is preferably provided on the display surface to improve visibility.

In the case of using a reflective or transflective liquid crystal element, a front light may be provided outside the polarizing plate. As the front light, an edge-lit front light is preferably used. A front light including an LED is preferably used to reduce power consumption.

[Light-Emitting Element]

As the light-emitting element, a self-luminous element can be used, and an element whose luminance is controlled by current or voltage is included in the category of the light-emitting element. For example, an LED, an organic EL element, or an inorganic EL element can be used.

The light-emitting element has a top-emission structure, a bottom-emission structure, a dual-emission structure, or the like. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

The EL layer can be formed using a low-molecular compound or a high-molecular compound and may also contain an inorganic compound. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer, and a light-emitting substance contained in the EL layer emits light.

In the case where a light-emitting element that emits white light is used as the light-emitting element, the EL layer preferably contains two or more kinds of light-emitting substances. For example, two or more kinds of light-emitting substances are selected so as to emit light of complementary colors to obtain white light emission. Specifically, it is preferable to contain two or more selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in a yellow wavelength range preferably includes spectral components also in green and red wavelength ranges.

Preferably, a light-emitting layer containing a light-emitting material emitting light of one color and a light-emitting layer containing a light-emitting material emitting light of another color are stacked in the EL layer. For example, a plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or the phosphorescent layer (e.g., a host material or an assist material) and no light-emitting material may be provided. This facilitates the manufacture of the light-emitting element and decreases the driving voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used for the conductive layer. For example, a stacked film of indium tin oxide and an alloy of silver and magnesium is preferably used, in which case the conductivity can be increased. Further alternatively, graphene or the like may be used.

For the conductive film that reflects visible light, a metal material such as aluminum, gold, platinum, silver, nickel, tungsten, chromium, molybdenum, iron, cobalt, copper, or palladium or an alloy containing any of these metal materials can be used, for example. Lanthanum, neodymium, germanium, or the like may be added to the metal material or the alloy. Alternatively, an alloy containing aluminum (an aluminum alloy), such as an alloy of aluminum and titanium, an alloy of aluminum and nickel, or an alloy of aluminum and neodymium may be used. Alternatively, an alloy containing silver, such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the above conductive film that transmits visible light and a film containing a metal material may be stacked. For example, a stack of silver and indium tin oxide or a stack of an alloy of silver and magnesium and indium tin oxide can be used.

Each of the electrodes can be formed by an evaporation method or a sputtering method. Alternatively, a discharging method such as an inkjet method, a printing method such as a screen printing method, or a plating method can be used.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, or a polymer). For example, a quantum dot used for the light-emitting layer can serve as a light-emitting material.

The quantum dot can be a colloidal quantum dot, an alloyed quantum dot, a core-shell quantum dot, a core quantum dot, or the like. A material containing elements belonging to Groups 12 and 16, elements belonging to Groups 13 and 15, or elements belonging to Groups 14 and 16 may be used. Alternatively, a quantum dot containing an element such as cadmium, selenium, zinc, sulfur, phosphorus, indium, tellurium, lead, gallium, arsenic, or aluminum may be used.

[Adhesive Layer]

As the adhesive layer, any of a variety of curable adhesives such as a photo-curable adhesive (e.g., an ultraviolet curable adhesive), a reactive curable adhesive, a thermosetting curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component resin may be used. Further alternatively, an adhesive sheet or the like may be used.

Furthermore, the resin may include a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display panel.

In addition, it is preferable to mix a filler with a high refractive index or a light-scattering member into the resin, in which case light extraction efficiency can be enhanced. For example, titanium oxide, barium oxide, zeolite, or zirconium can be used.

[Connection Layer]

As the connection layer, an anisotropic conductive film (ACF), an anisotropic conductive paste (ACP), or the like can be used.

[Coloring Layer]

Examples of a material that can be used for the coloring layer include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. A stack of films containing materials of the coloring layer can also be used for the light-blocking layer. For example, it is possible to employ a stacked-layer structure of a film containing a material of a coloring layer that transmits light of a certain color and a film containing a material of a coloring layer that transmits light of another color. The coloring layer and the light-blocking layer are preferably formed using the same material because the same manufacturing apparatus can be used and the process can be simplified.

At least part of this embodiment can be implemented in combination with any of the other embodiments described in this specification as appropriate.

Embodiment 3

Examples of electronic devices that can use the display device described in Embodiment 2 include display appliances, personal computers, image memory devices and image reproducing devices provided with storage media, mobile phones, game machines (including portable game machines), portable data terminals, e-book readers, cameras such as video cameras and digital still cameras, goggle-type displays (head-mounted displays), navigation systems, audio reproducing devices (e.g., car audio players and digital audio players), copiers, facsimiles, printers, multi-function printers, automated teller machines (ATM), and vending machines. FIGS. 17A to 17F show specific examples of these electronic devices.

Figure 17A:
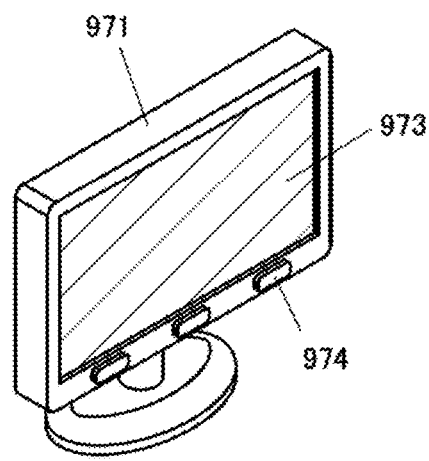
FIGS. 17A to 17F each illustrate an electronic device.

FIG. 17A illustrates a navigation system that includes a housing 971, a display portion 973, an operation key 974, and the like. The display portion 973 is provided with a touch sensor that enables principal input operations. Using the display device of Embodiment 2 in the navigation system of FIG. 17A allows power consumption to be reduced and suppresses an increase in size of the navigation system.

Figure 17B:
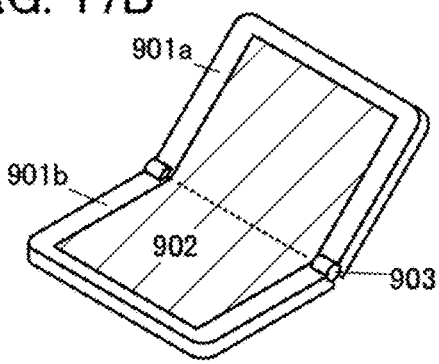

FIG. 17B illustrates a foldable electronic device that includes a housing 901a, a housing 901b, a hinge 903, a display portion 902, and the like. The display portion 902 is incorporated into the housing 901a and the housing 901b.

The housing 901a and the housing 901b are rotatably joined to each other by the hinge 903. The electronic device can be changed in shape between a state where the housing 901a and the housing 901b are closed and a state where they are opened. Thus, the electronic device has high portability when carried and excels in visibility when used because of its large display region.

The hinge 903 preferably includes a locking mechanism so that an angle between the housing 901a and the housing 901b does not become larger than a predetermined angle when the housing 901a and the housing 901b are opened. For example, an angle at which they become locked (they are not opened any further) is preferably greater than or equal to 90° and less than 180° and can be typically 90°, 120°, 135°, 150°, 175°, or the like. In that case, the convenience, safety, and reliability can be improved.

The display portion 902 functions as a touch panel and can be controlled with a finger, a stylus, or the like.

One of the housing 901a and the housing 901b is provided with a wireless communication module, and data can be transmitted and received through a computer network such as the Internet, a local area network (LAN), or Wi-Fi (registered trademark).

The display portion 902 is preferably formed using one flexible display, in which case an image can be displayed continuously between the housing 901a and the housing 901b. Note that each of the housings 901a and 901b may be provided with a display.

Using the display device of Embodiment 2 in the foldable electronic device of FIG. 17B allows power consumption to be reduced and suppresses an increase in size of the foldable electronic device.

Figure 17C:
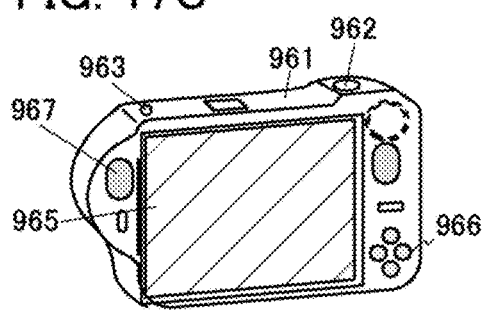

FIG. 17C illustrates a digital camera that includes a housing 961, a shutter button 962, a microphone 963, a speaker 967, a display portion 965, an operation key 966, and the like. Using the display device of Embodiment 2 in the digital camera of FIG. 17C allows power consumption to be reduced and suppresses an increase in size of the digital camera.

Figure 17D:
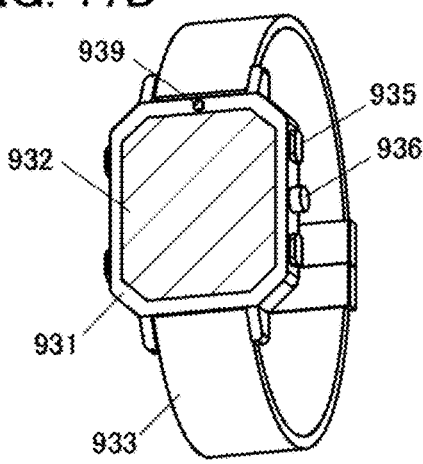

FIG. 17D illustrates a wrist-watch-type information terminal that includes a housing 931, a display portion 932, a wristband 933, an operation button 935, a winder 936, a camera 939, and the like. The display portion 932 may be a touch panel. Using the display device of Embodiment 2 in the wrist-watch-type information terminal of FIG. 17D allows power consumption to be reduced and suppresses an increase in size of the wrist-watch-type information terminal.

Figure 17E:
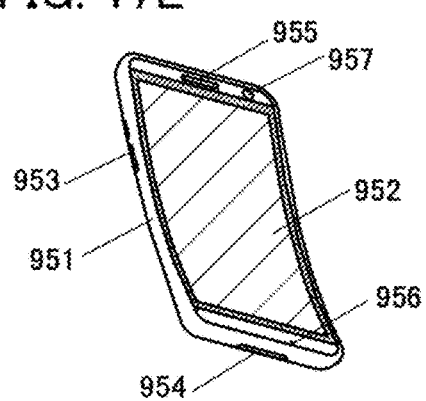

FIG. 17E shows an example of a mobile phone that includes a housing 951, a display portion 952, an operation button 953, an external connection port 954, a speaker 955, a microphone 956, a camera 957, and the like. The mobile phone includes a touch sensor in the display portion 952. Operations such as making a call and inputting letters can be performed by touch on the display portion 952 with a finger, a stylus, or the like. Using the display device of Embodiment 2 in the mobile phone of FIG. 17E allows power consumption to be reduced and suppresses an increase in size of the mobile phone.

Figure 17F:
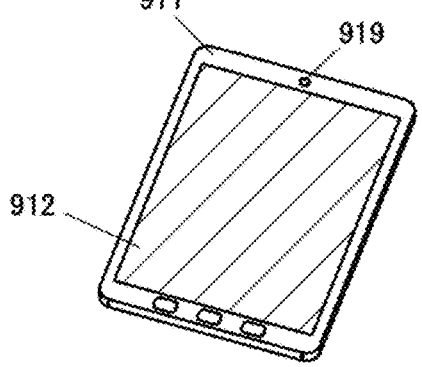

FIG. 17F illustrates a portable data terminal that includes a housing 911, a display portion 912, a camera 919, and the like. A touch panel function of the display portion 912 enables input and output of information. Using the display device of Embodiment 2 in the portable data terminal of FIG. 17F allows power consumption to be reduced and suppresses an increase in size of the portable data terminal.

At least part of this embodiment can be implemented in combination with any of the other embodiments described in this specification as appropriate.

This application is based on Japanese Patent Application Serial No. 2016-191724 filed with Japan Patent Office on Sep. 29, 2016, the entire contents of which are hereby incorporated by reference.

What is claimed is:

1. A semiconductor device comprising:
a level shift circuit comprising a first transistor, a second transistor, a third transistor, a fourth transistor, and a buffer circuit,
wherein:
one of a source and a drain of the first transistor is electrically connected to one of a source and a drain of the second transistor,
the other of the source and the drain of the second transistor is electrically connected to one of a source and a drain of the third transistor,
a gate of the first transistor is electrically connected to a gate of the fourth transistor,
the gate of the first transistor is electrically connected to the one of the source and the drain of the first transistor through the second transistor,
a gate of the third transistor is electrically connected to a wiring to which an input signal is input,
an input terminal of the buffer circuit is electrically connected to one of a source and a drain of the fourth transistor, and
an output terminal of the buffer circuit is electrically connected to a gate of the second transistor.

2. The semiconductor device according to claim 1, wherein:
the level shift circuit further comprises a fifth transistor,
one of a source and a drain of the fifth transistor is electrically connected to the one of the source and the drain of the fourth transistor, and
a gate of the fifth transistor is electrically connected to a wiring to which an inversion signal of the input signal is input.

3. The semiconductor device according to claim 1, wherein:
the buffer circuit comprises a first inverter circuit and a second inverter circuit,
the first inverter circuit comprises a first input terminal, a second input terminal, and an output terminal,
the second inverter circuit comprises a first input terminal, a second input terminal, and an output terminal,
the first input terminal of the first inverter circuit serves as the input terminal of the buffer circuit,
the second input terminal of the first inverter circuit is electrically connected to the wiring to which the input signal is input,
the first input terminal of the second inverter circuit is electrically connected to the output terminal of the first inverter circuit,
the second input terminal of the second inverter circuit is electrically connected to a wiring to which an inversion signal of the input signal is input, and
the output terminal of the second inverter circuit serves as the output terminal of the buffer circuit.

4. The semiconductor device according to claim 1, wherein each of the first transistor, the second transistor, and the fourth transistor is a p-channel transistor.

5. The semiconductor device according to claim 1, wherein each of the third transistor and the fifth transistor is a n-channel transistor and comprises an oxide semiconductor layer.

6. A semiconductor device comprising:
a level shift circuit comprising a first transistor, a second transistor, a third transistor, a fourth transistor, a fifth transistor, a sixth transistor, a seventh transistor, an eighth transistor, and a ninth transistor,
wherein:
one of a source and a drain of the first transistor is electrically connected to one of a source and a drain of the second transistor,
the other of the source and the drain of the second transistor is electrically connected to one of a source and a drain of the third transistor,
one of a source and a drain of the fourth transistor is electrically connected to one of a source and a drain of the fifth transistor,
a gate of the first transistor is electrically connected to a gate of the fourth transistor,
the gate of the first transistor is electrically connected to the one of the source and the drain of the first transistor through the second transistor,
one of a source and a drain of the sixth transistor is electrically connected to one of a source and a drain of the seventh transistor,
a gate of the sixth transistor is electrically connected to the one of the source and the drain of the fourth transistor,
a gate of the seventh transistor is electrically connected to a gate of the third transistor,
one of a source and a drain of the eighth transistor is electrically connected to one of a source and a drain of the ninth transistor,
a gate of the eighth transistor is electrically connected to the one of the source and the drain of the sixth transistor,
a gate of the ninth transistor is electrically connected to a gate of the fifth transistor, and
the one of the source and the drain of the eighth transistor is electrically connected to a gate of the second transistor.

7. The semiconductor device according to claim 6, wherein each of the first transistor, the second transistor, the fourth transistor, the sixth transistor, and the eighth transistor is a p-channel transistor.

8. The semiconductor device according to claim 6, wherein each of the third transistor, the fifth transistor, the seventh transistor, and the ninth transistor is a n-channel transistor and comprises an oxide semiconductor layer.

9. The semiconductor device according to claim 6, further comprising at least one of a logic circuit, a shift register, a latch circuit, a digital-to-analog converter circuit, a multiplexer, and an amplifier circuit.

10. An electronic device comprising:
the semiconductor device according to claim 6; and
at least one of a display portion, a touch sensor, a camera, a speaker, a microphone, and an operation key.

* * * * *